US011121260B2

(12) United States Patent
Park et al.

(10) Patent No.: US 11,121,260 B2
(45) Date of Patent: Sep. 14, 2021

(54) THIN-FILM TRANSISTOR, DISPLAY DEVICE INCLUDING THE SAME, AND METHOD OF MANUFACTURING THE SAME

(71) Applicant: LG Display Co., Ltd., Seoul (KR)

(72) Inventors: SeHee Park, Paju-si (KR); JungSeok Seo, Paju-si (KR); PilSang Yun, Paju-si (KR); Jeyong Jeon, Paju-si (KR); Jaeyoon Park, Paju-si (KR); ChanYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/705,767

(22) Filed: Dec. 6, 2019

(65) Prior Publication Data
US 2020/0203534 A1 Jun. 25, 2020

(30) Foreign Application Priority Data
Dec. 19, 2018 (KR) .................. 10-2018-0165362

(51) Int. Cl.
| | |
|---|---|
| H01L 29/78 | (2006.01) |
| H01L 29/49 | (2006.01) |
| H01L 29/786 | (2006.01) |
| H01L 29/66 | (2006.01) |
| H01L 29/24 | (2006.01) |

(52) U.S. Cl.
CPC .......... H01L 29/7869 (2013.01); H01L 29/24 (2013.01); H01L 29/4908 (2013.01); H01L 29/66742 (2013.01)

(58) Field of Classification Search
CPC . H01L 29/7869; H01L 29/24; H01L 29/4908; H01L 29/66742

USPC ................... 257/43; 438/85, 86, 104, 754
See application file for complete search history.

(56) References Cited

U.S. PATENT DOCUMENTS

| | | | | |
|---|---|---|---|---|
| 2011/0140100 | A1* | 6/2011 | Takata | ............... H01L 29/7869 257/43 |
| 2014/0001465 | A1* | 1/2014 | Yamazaki | ............ H01L 29/7869 257/43 |
| 2014/0022480 | A1* | 1/2014 | Yokoyama | ......... G02F 1/133345 349/43 |
| 2014/0042438 | A1* | 2/2014 | Yamazaki | .......... H01L 29/78693 257/43 |

(Continued)

FOREIGN PATENT DOCUMENTS

KR  10-2017-0102369 A  9/2017

*Primary Examiner* — Didarul A Mazumder
(74) *Attorney, Agent, or Firm* — Morgan, Lewis & Bockius LLP

(57) ABSTRACT

A thin-film transistor, a display device including a thin-film transistor, and a method of manufacturing a thin-film transistor are provided. A thin-film transistor includes: a base substrate, a semiconductor layer on the base substrate, the semiconductor layer including: a first oxide semiconductor layer, and a second oxide semiconductor layer on the first oxide semiconductor layer, the second oxide semiconductor layer having a Hall mobility smaller than a Hall mobility of the first oxide semiconductor layer, and a gate electrode spaced apart from the semiconductor layer and partially overlapping the semiconductor layer, wherein a concentration of gallium (Ga) in the second oxide semiconductor layer is higher than a concentration of gallium (Ga) in the first oxide semiconductor layer.

23 Claims, 15 Drawing Sheets

(56) References Cited

U.S. PATENT DOCUMENTS

| | | | |
|---|---|---|---|
| 2014/0110706 A1* | 4/2014 | Yamazaki | H01L 29/42384 257/43 |
| 2014/0307194 A1* | 10/2014 | Suzumura | G02F 1/134309 349/43 |
| 2015/0014823 A1 | 1/2015 | Mallikarjunan et al. | |
| 2015/0155505 A1* | 6/2015 | Yamazaki | H01L 29/24 257/40 |
| 2016/0284862 A1* | 9/2016 | Yamazaki | H01L 29/7869 |
| 2017/0294456 A1* | 10/2017 | Lee | H01L 21/02595 |

* cited by examiner

THIN-FILM TRANSISTOR, DISPLAY DEVICE INCLUDING THE SAME, AND METHOD OF MANUFACTURING THE SAME

CROSS-REFERENCE TO RELATED APPLICATION(S)

This application claims the benefit of and priority to Korean Patent Application No. 10-2018-0165362, filed on Dec. 19, 2018, the entirety of which is hereby incorporated by reference.

BACKGROUND

1. Technical Field

The present disclosure relates to a thin-film transistor, a display device including the same, and a method of manufacturing the same. More particularly, the present disclosure relates to a thin-film transistor including an interfacial channel layer configured to protect a main channel layer, a display device including the same, and a method of manufacturing the same.

2. Discussion of the Related Art

A thin-film transistor may be manufactured on a glass substrate or a plastic substrate, and the thin-film transistor is widely used as a switching device or a driving device in a display device, such as a liquid crystal display device or an organic light-emitting device. According to a material used for an active layer, the thin-film transistor may be categorized into an amorphous silicon thin-film transistor having an active layer of amorphous silicon, a polycrystalline silicon thin-film transistor having an active layer of polycrystalline silicon, and an oxide semiconductor thin-film transistor having an active layer of oxide semiconductor.

The amorphous silicon is deposited in a short time, and is formed as an active layer, whereby the amorphous silicon thin-film transistor (a-Si TFT) has advantages of short manufacturing time and low manufacturing cost. Meanwhile, it has disadvantages of inferior current driving efficiency due to low mobility, and a change of a threshold voltage. Thus, it is difficult to use the amorphous silicon thin-film transistor for an active matrix organic light-emitting device (AMOLED).

The polycrystalline silicon thin-film transistor (poly-Si TFT) may be obtained by depositing amorphous silicon and crystallizing the deposited amorphous silicon. The polycrystalline silicon thin-film transistor has advantages of high electron mobility and great stability, realization of a thin profile and high resolution, and high power efficiency. The polycrystalline silicon thin-film transistor may include a low-temperature polysilicon (LTPS) thin-film transistor, and a polysilicon thin-film transistor. However, a process of manufacturing the polycrystalline silicon thin-film transistor inevitably needs a step of crystallizing the amorphous silicon, whereby a manufacturing cost is increased due to the increased number of manufacturing steps. Also, the polycrystalline silicon thin-film transistor has a disadvantage of crystallization at a high temperature. Thus, it is difficult to apply the polycrystalline silicon thin-film transistor to a large-sized display device.

The oxide semiconductor thin-film transistor ("oxide semiconductor TFT"), which has high mobility and has a large resistance change in accordance with an oxygen content, is advantageous in that it facilitates obtaining desired properties. Also, an active layer of oxide is formed at a relatively low temperature for a process of manufacturing the oxide semiconductor thin-film transistor, whereby it is possible to lower a manufacturing cost. Also, owing to the properties of oxide, an oxide semiconductor is transparent, whereby it is favorable to realization of a transparent display device. However, in comparison with the polycrystalline silicon thin-film transistor, the oxide semiconductor thin-film transistor has relatively low stability and electron mobility.

Respective materials constituting a semiconductor layer corresponding to an active layer of a thin-film transistor have different properties, and have different advantages and disadvantages from each other. Thus, as the different materials are mixed to decrease the weakness and increase the strength, it is possible to improve reliability and function of the thin-film transistor.

SUMMARY

Accordingly, the present disclosure is directed to a thin-film transistor, a display device including the same, and a method of manufacturing the same that substantially obviate one or more of the issues due to limitations and disadvantages of the related art.

An aspect of the present disclosure is to provide a thin-film transistor including a main channel layer and an interfacial channel layer, wherein the interfacial channel layer protects the main channel layer, a display device comprising the same, and a method of manufacturing the same.

Another aspect of the present disclosure is to provide a thin-film transistor including a semiconductor layer including a plurality of oxide semiconductor layers, wherein a mixture area may be formed between each of the oxide semiconductor layers, and a thickness of the mixture area may be reduced or minimized, a display device comprising the same, and a method of manufacturing the same.

Another aspect of the present disclosure is to provide a thin-film transistor including a high-density gate insulating layer, wherein it is possible to reduce or prevent a defect in a semiconductor layer by reducing, minimizing, or preventing an electron trap by the gate insulating layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a thin-film transistor, including: a base substrate, a semiconductor layer on the base substrate, the semiconductor layer including: a first oxide semiconductor layer, and a second oxide semiconductor layer on the first oxide semiconductor layer, the second oxide semiconductor layer having a Hall mobility smaller than a Hall mobility of the first oxide semiconductor layer, and a gate electrode spaced apart from the semiconductor layer and partially overlapping the semiconductor layer, wherein a concentration of gallium (Ga) in the second oxide semiconductor layer is higher than a concentration of gallium (Ga) in the first oxide semiconductor layer.

In another aspect, there is provided a display device, including: a base substrate, a pixel driving circuit on the base substrate, the pixel driving circuit including a thin-film transistor, the thin-film transistor including: a semiconductor layer on the base substrate, the semiconductor layer including: a first oxide semiconductor layer, and a second oxide semiconductor layer on the first oxide semiconductor layer, the second oxide semiconductor layer having a Hall mobility smaller than a Hall mobility of the first oxide semiconductor layer, and a gate electrode spaced apart from the semiconductor layer and partially overlapping the semiconductor layer, and a display element connected to the pixel driving circuit, wherein a concentration of gallium (Ga) in the second oxide semiconductor layer is higher than a concentration of gallium (Ga) in the first oxide semiconductor layer.

In another aspect, there is provided a method of manufacturing a thin-film transistor, the method including: providing a base substrate, providing a semiconductor layer on the base substrate, the providing the semiconductor layer including: forming a first oxide semiconductor layer by metal-organic chemical vapor deposition (MOCVD), and forming a second oxide semiconductor layer, by MOCVD, on the first oxide semiconductor layer, the second oxide semiconductor layer having a Hall mobility smaller than a Hall mobility of the first oxide semiconductor layer, and providing a gate electrode spaced apart from the semiconductor layer and partially overlapping the semiconductor layer, wherein a concentration of gallium (Ga) in the second oxide semiconductor layer is higher than a concentration of gallium (Ga) in the first oxide semiconductor layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
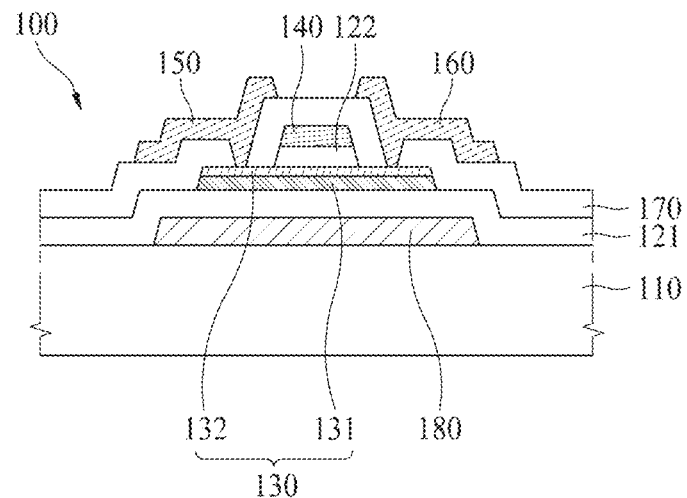
FIG. 1 is a cross-sectional view illustrating a thin-film transistor according to one embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin-film transistor according to one embodiment of the present disclosure.

A thin-film transistor 100 according to one embodiment of the present disclosure may include a base substrate 110, a semiconductor layer 130 on the base substrate 110, and a gate electrode 140 spaced apart from the semiconductor layer 130 and partially overlapping the semiconductor layer 130. With reference to FIG. 1, the semiconductor layer 130 may be on the base substrate 110. The base substrate 110 may support the semiconductor layer 130.

The base substrate 110 may be not limited to a specific kind. The base substrate 110 may be formed in any layer or structure capable of supporting the semiconductor layer 130. For example, the base substrate 110 may include glass or plastic. The base substrate 110 may include a transparent plastic material having flexibility, for example, polyimide (PI).

A buffer layer 121 may be on the base substrate 110. The buffer layer 121 may include at least one of: silicon oxide and silicon nitride. The buffer layer 121 may be formed in a single-layered structure, or in a multi-layered structure having at least two layers. The buffer layer 121 may have good insulating properties and good planarization properties, and the buffer layer 121 may protect the semiconductor layer 130. The buffer layer 121 may be omitted.

With further reference to FIG. 1, a light-shielding layer 180 may be on the base substrate 110. The light-shielding layer 180 may block light, which may be incident on the semiconductor layer 130 of the thin-film transistor from an external environment, to thereby reduce or prevent the semiconductor layer 130 from being damaged by the externally-provided light. The buffer layer 121 may be on the light-shielding layer 180. The light-shielding layer 180 may be omitted.

The semiconductor layer 130 may include a first oxide semiconductor layer 131, and a second oxide semiconductor layer 132. With additional reference to FIG. 1, the second oxide semiconductor layer 132 may be on the first oxide semiconductor layer 131.

According to one embodiment of the present disclosure, the first oxide semiconductor layer 131 may function as a main channel layer. The second oxide semiconductor layer 132 may protect the first oxide semiconductor layer 131 functioning as the main channel layer. Thus, the first oxide semiconductor layer 131 may be referred to as the "main channel layer," and the second oxide semiconductor layer 132 may be referred to as an "interfacial channel layer."

A Hall mobility of the first oxide semiconductor layer 131 may be larger than a Hall mobility of the second oxide semiconductor layer 132. Thus, a main channel for a current flow may be formed in the first oxide semiconductor layer 131.

According to one embodiment of the present disclosure, the first oxide semiconductor layer 131 may include indium (In). Herein, indium (In) may improve charge density and mobility of the oxide semiconductor layer. The first oxide semiconductor layer 131 including indium (In) may have good Hall mobility. According to one embodiment of the present disclosure, a concentration of indium (In) in the first oxide semiconductor layer 131 may be higher than a concentration of indium (In) in the second oxide semiconductor layer 132.

According to one embodiment of the present disclosure, for example, the first oxide semiconductor layer 131 may include an IZO (indium zinc oxide; InZnO)-based oxide semiconductor material, IGO (InGaO)-based oxide semiconductor material, an ITO (indium tin oxide; InSnO)-based oxide semiconductor material, an IGZO (InGaZnO)-based oxide semiconductor material, an IGZTO (InGaZnSnO)- based oxide semiconductor material, or an ITZO (indium tin zinc oxide; InSnZnO)-based oxide semiconductor material. However, embodiments of the present disclosure may be not limited to the above. The first oxide semiconductor layer 131 may include other oxide semiconductor materials generally known to those in the art. For example, the first oxide semiconductor layer 131 may include a GZTO (GaZnSnO)-based oxide semiconductor material, in which indium (In) may not be included.

According to one embodiment of the present disclosure, the first oxide semiconductor layer 131 may have a thickness of 3 nm to 30 nm. If the thickness of the first oxide semiconductor layer 131 is too small, the film stability of the first oxide semiconductor layer 131 may be lowered so that it may be difficult to provide a uniform film. Thus, the first oxide semiconductor layer 131 may have a thickness of 3 nm or more. Meanwhile, if the thickness of the first oxide semiconductor layer 131 is increased more than the necessary, a variable width of a threshold voltage in the thin-film transistor 100, including the first oxide semiconductor layer 131, may be increased. Thus, the first oxide semiconductor layer 131 may have a thickness of 30 nm or less. For example, the first oxide semiconductor layer 131 may have a thickness of 5 nm to 15 nm.

According to one embodiment of the present disclosure, in comparison with the first oxide semiconductor layer 131, the second oxide semiconductor layer 132 may be further away from the base substrate 110. With respect to the base substrate 110, the second oxide semiconductor layer 132 may be above the first oxide semiconductor layer 131, to thereby reduce or prevent the first oxide semiconductor layer 131 from being damaged by an insulating layer or insulating film above the semiconductor layer 130.

For example, the second oxide semiconductor layer 132 may reduce or prevent hydrogen, included in an insulating layer or insulating film outside the semiconductor layer 130, from permeating into the first oxide semiconductor layer 131, or may reduce or prevent an electron of the first oxide semiconductor layer 131 from being trapped by an insulating layer or insulating film outside the semiconductor layer 130. Thus, it may be possible to reduce or prevent the electrical properties of the first oxide semiconductor layer 131 from being deteriorated. The second oxide semiconductor layer 132 may serve as an auxiliary channel layer, as a passivation layer to prevent hydrogenation of the first oxide semiconductor layer 131, and as an etch stopper layer to prevent damage to the first oxide semiconductor layer 131 during fabrication of the thin-film transistor.

The second oxide semiconductor layer 132, which may function as the interfacial channel layer in addition to the protection layer, has good film stability and good mechanical stability. For good film stability and good mechanical stability, the second oxide semiconductor layer 132 may include gallium (Ga). Herein, gallium (Ga) may form a stabilized bonding to oxygen, and gallium oxide has good film stability. Thus, if the film includes gallium (Ga), it may be possible to realize good film stability.

According to one embodiment of the present disclosure, the first oxide semiconductor layer 131 may also include gallium (Ga). Even though the first oxide semiconductor layer 131 may include gallium (Ga), a concentration of gallium (Ga) in the second oxide semiconductor layer may be higher than a concentration of gallium (Ga) in the first oxide semiconductor layer. The concentration of gallium (Ga) may be expressed as a ratio of a number of atoms of gallium (Ga) to a total number of metallic elements included in each oxide semiconductor layer.

According to one embodiment of the present disclosure, the second oxide semiconductor layer 132 may include one or more of: an IGZO (indium gallium zinc oxide; InGaZnO)-based oxide semiconductor material, an IGO (indium gallium oxide; InGaO)-based oxide semiconductor material, an IGTO (indium gallium tin oxide; InGaSnO)-based oxide semiconductor material, an IGZTO (indium gallium zinc tin oxide; InGaZnSnO)-based oxide semiconductor material, a GZTO (gallium zinc tin oxide; GaZnSnO)-based oxide semiconductor material, a GZO (gallium zinc oxide; GaZnO)-based oxide semiconductor material, and a GO (gallium oxide; GaO)-based oxide semiconductor material. Embodiments are not limited to these examples.

For good film stability, the second oxide semiconductor layer 132 may include gallium (Ga) of 40 atom % or more in comparison with a total metallic element with respect to a number of atoms. If gallium (Ga) of 40 atom % or more is included in the total metallic element of the second oxide semiconductor layer 132, the second oxide semiconductor layer 132 may have good film stability.

According to one embodiment of the present disclosure, the metallic element of the second oxide semiconductor layer 132 may be all gallium (Ga). In this case, the second oxide semiconductor layer 132 may include the GO (GaO)-based oxide semiconductor material, and the content of gallium (Ga) in the entire metallic element of the second oxide semiconductor layer 132 may be 100 atom %.

The second oxide semiconductor layer 132 having the good film stability and good mechanical stability may have a relatively larger resistance in comparison with that of the first oxide semiconductor layer 131. Also, because the second oxide semiconductor layer 132 may also function as the channel layer, the second oxide semiconductor layer 132 may also have relatively good electrical properties. In consideration of the electrical properties of the second oxide semiconductor layer 132, the second oxide semiconductor layer 132 may include gallium (Ga) of 90 atom % or less in comparison with the total metallic element, and may further include other metallic elements capable of improving mobility or carrier concentration.

In consideration of the film stability and electrical properties, the second oxide semiconductor layer 132 may have a thickness of 1 nm to 10 nm. If the thickness of the second oxide semiconductor layer 132 may be less than 1 nm, the film stability of the second oxide semiconductor layer 132 may be deteriorated so that the second oxide semiconductor layer 132 might not provide a sufficient protection for the first oxide semiconductor layer 131. Thus, the thickness of the second oxide semiconductor layer 132 may have to be 1 nm or more.

Meanwhile, in comparison with the first oxide semiconductor layer 131, the second oxide semiconductor layer 132 may have a relatively larger resistance and lower Hall mobility. If the thickness of the second oxide semiconductor layer 132 is more than 10 nm, it may be an obstacle to a current flow through the semiconductor layer 130. For example, on the presumption that a source electrode 150 and a drain electrode 160 are in contact with the second oxide semiconductor layer 132, and if the thickness of the second oxide semiconductor layer 132 is increased more than necessary, the electrical properties of the thin-film transistor 100 may be deteriorated. Accordingly, the thickness of the second oxide semiconductor layer 132 may have to be 10 nm or less.

According to one embodiment of the present disclosure, the first oxide semiconductor layer 131 and the second oxide semiconductor layer 132 may be formed by metal-organic chemical vapor deposition (MOCVD). If the first oxide semiconductor layer 131 and the second oxide semiconductor layer 132 are formed by MOCVD, it may be possible to form the first oxide semiconductor layer 131 and the second oxide semiconductor layer 132 having a uniform surface, thin profile, and good film stability.

Also, if the first oxide semiconductor layer 131 and the second oxide semiconductor layer 132 are formed by MOCVD, the interface between the first oxide semiconductor layer 131 and the second oxide semiconductor layer 132 may be clearly distinct, so that a mixed area between the first oxide semiconductor layer 131 and the second oxide semiconductor layer 132 may be decreased in its thickness. As a result, an effective thickness reduction between the first oxide semiconductor layer 131 and the second oxide semiconductor layer 132 may be reduced or minimized. Thus, even though the first oxide semiconductor layer 131 and the second oxide semiconductor layer 132 may have the small thickness, each oxide semiconductor layer may smoothly perform its particular function.

If all of the first oxide semiconductor layer 131 and the second oxide semiconductor layer 132 are formed by metal-organic chemical vapor deposition (MOCVD), the first oxide semiconductor layer 131 and the second oxide semiconductor layer 132 may be sequentially formed without a vacuum braking step. As a result, it may be possible to decrease a manufacturing cost and to improve process stability.

A gate insulating layer 122 may be on the semiconductor layer 130. The gate insulating layer 122 may include at least one of: silicon oxide and silicon nitride. The gate insulating layer 122 may include oxide aluminum ($Al_2O_3$). The gate insulating layer 122 may be formed in a single-layered structure or in a multi-layered structure.

According to one embodiment of the present disclosure, the gate insulating layer 122 may be formed by metal-organic chemical vapor deposition (MOCVD). If the gate insulating layer 122 is formed by MOCVD, it may be possible to form the gate insulating layer 122 having a high density, a uniform surface, and good film stability.

If the gate insulating layer 122 and the semiconductor layer 130 are formed by metal-organic chemical vapor deposition (MOCVD), it may be possible to sequentially form the semiconductor layer 130 and the gate insulating layer 122 without a vacuum braking step. As a result, it may be possible to decrease a manufacturing cost and to improve process stability.

For example, according to one embodiment of the present disclosure, the gate insulating layer 121 having high density may be formed by MOCVD. As a result it is possible to reduce or prevent a defect in a semiconductor layer by reducing, minimizing, or preventing an electron trap by the gate insulating layer.

For example, the gate insulating layer 122 may include an $SiO_2$-based oxide including silicon and oxygen. For example, the gate insulating layer 122 may be a high-density $SiO_2$-based oxide layer formed by MOCVD. In comparison with a low-density $SiO_2$-based oxide layer, the high-density $SiO_2$-based oxide layer may include a relatively small amount of hydrogen (H), and may have a relatively high $SiO_2$ bond rate. According to one embodiment of the present disclosure, the gate insulating layer 122 may include hydrogen (H) of 2 atom % or less in comparison with a total number of atoms of the gate insulating layer 122.

With further reference to FIG. 1, the gate electrode 140 may be on the gate insulating layer 122. The gate electrode 140 may be insulated from the semiconductor layer 130, and may partially overlap the semiconductor layer 130.

Some areas of the semiconductor layer 130 overlapping the gate electrode 140 may become a channel region. The remaining areas of the semiconductor layer 130, which may not overlap the gate electrode 140, may become conducting areas by conductorization, and may be a source region or a drain region. The conducting areas of the semiconductor layer 130 may function as a wiring.

The gate electrode 140 may include one or more of: an aluminum-based metal, such as aluminum (Al) or an aluminum alloy; a silver-based metal, such as silver (Ag) or a silver alloy; a copper-based metal, such as copper (Cu) or a copper alloy; a molybdenum-based metal, such as molybdenum (Mo) or a molybdenum alloy; chromium (Cr); tantalum (Ta); neodymium (Nd); and titanium (Ti). The gate electrode 140 may have a multi-layered structure, including at least two layers with different physical properties.

With additional reference to FIG. 1, the semiconductor layer 130 may be between the gate electrode 140 and the base substrate 110. The second oxide semiconductor layer 132 may be closer to the gate electrode 140, in comparison with the first oxide semiconductor layer 131.

An insulating interlayer 170 may be on the gate electrode 140. The insulating interlayer 170 may include an insulating material. For example, the insulating interlayer 170 may include an organic material, an inorganic material, or a deposition structure including an organic material and an inorganic material.

The thin-film transistor 100 according to one embodiment of the present disclosure may include the source electrode 150 and the drain electrode 160. With further reference to FIG. 1, the source electrode 150 and the drain electrode 160 may be on the insulating interlayer 170. The source electrode 150 and the drain electrode 160 may be spaced apart from each other, and may be connected to the semiconductor layer 130. With additional reference to FIG. 1, the source electrode 150 and the drain electrode 160 may be respectively connected to the semiconductor layer 130 through contact holes provided in the insulating interlayer 170. For example, each of the source electrode 150 and the drain electrode 160 may be connected to the second oxide semiconductor layer 132 of the semiconductor layer 130.

The source electrode 150 and the drain electrode 160 may include one or more of: molybdenum (Mo), aluminum (Al), chrome (Cr), gold (Au), titanium (Ti), nickel (Ni), neodymium (Nd), copper (Cu), and their alloys. Each of the source electrode 150 and the drain electrode 160 may be formed in a single-layered structure including the above metal or its alloy, or may be formed in a multi-layered structure including at least two layers of the above metal or its alloy.

The semiconductor layer 130, the gate electrode 140, the source electrode 150, and the drain electrode 160, which are shown in the example of FIG. 1, constitute the thin-film transistor 100. However, embodiments of the present disclosure are not limited to the above. For example, other areas of the semiconductor layer 130, other than the channel region overlapping the gate electrode 140, may become conducting areas by conductorization, and then the conducting areas may become the source region and the drain region, which may be spaced apart from each other with respect to the channel region interposed therebetween. Thus, the source region and the drain region may serve as the source electrode 150 and the drain electrode 160, respectively.

Figure 2:
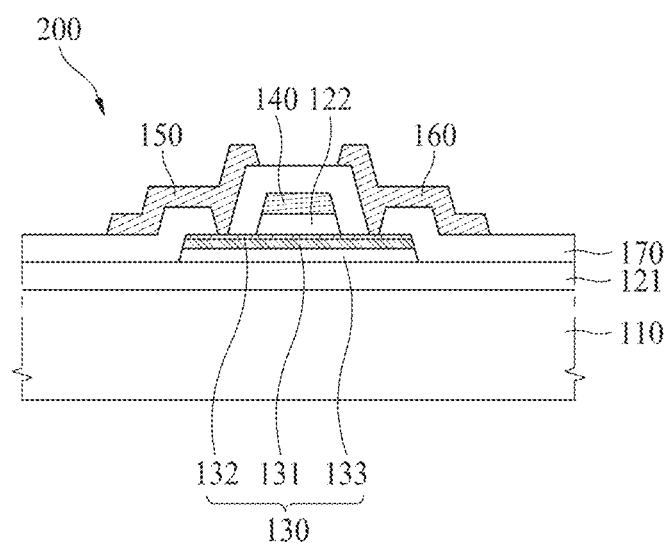
FIG. 2 is a cross-sectional view illustrating a thin-film transistor according to another embodiment of the present disclosure.

FIG. 2 is a cross-sectional view illustrating a thin-film transistor according to another embodiment of the present disclosure.

Hereinafter, to avoid a repetitive explanation, a detailed description for the same parts will be omitted. In case of a thin-film transistor 200 shown in the example of FIG. 2, in comparison with the thin-film transistor 100 shown in the example of FIG. 1, a semiconductor layer 130 may further include a third oxide semiconductor layer 133. Also, it may be possible to omit a light-shielding layer 180 from the thin-film transistor 200 shown in FIG. 2.

With reference to FIG. 2, as shown in the drawing, the third oxide semiconductor layer 133 may be below a first oxide semiconductor layer 131. Thus, according to one embodiment of the present disclosure, the first oxide semiconductor layer 131 may be between a second oxide semiconductor layer 132 and the third oxide semiconductor layer 133.

According to one embodiment of the present disclosure, the third oxide semiconductor layer 133 may serve as a supporting layer for supporting the first oxide semiconductor layer 131 corresponding to a main channel layer. The third oxide semiconductor layer 133 serving as the supporting layer may have good film stability and good mechanical properties.

For the good film stability, the third oxide semiconductor layer 133 may include gallium (Ga). Herein, gallium (Ga) may form a stabilized bonding to oxygen, and may enable the formation of a stable film.

According to one embodiment of the present disclosure, the third oxide semiconductor layer 133 may include one or more of: an IGZO (InGaZnO)-based oxide semiconductor material, an IGO (InGaO)-based oxide semiconductor material, an IGTO (InGaSnO)-based oxide semiconductor material, an IGZTO (InGaZnSnO)-based oxide semiconductor material, a GZTO (GaZnSnO)-based oxide semiconductor material, a GZO (GaZnO)-based oxide semiconductor material, and a GO (GaO)-based oxide semiconductor material. For good film stability, the third oxide semiconductor layer 133 may include gallium (Ga) of 40 atom % or more than 40 atom % in comparison with a total metallic element of the third oxide semiconductor layer 133. To stably support first oxide semiconductor layer 131, the third oxide semiconductor layer 133 may have a low concentration of the carrier. For example, the third oxide semiconductor layer 133 may have a higher concentration of gallium (Ga) than that of the second oxide semiconductor layer 132.

According to one embodiment of the present disclosure, the metallic element of the third oxide semiconductor layer 133 may be all gallium (Ga). In this case, the third oxide semiconductor layer 133 may include the GO (GaO)-based oxide semiconductor material, and the content of gallium (Ga) in the entire metallic element of the third oxide semiconductor layer 133 may be 100 atom %.

According to one embodiment of the present disclosure, the third oxide semiconductor layer 133 may have a thickness of 5 nm to 50 nm. If the thickness of the third oxide semiconductor layer 133 is less than 5 nm, the third oxide semiconductor layer 133 may not provide a sufficient function as the supporting layer, and the first oxide semiconductor layer 131 may not be stably supported by the third oxide semiconductor layer 133. Meanwhile, if the thickness of the third oxide semiconductor layer 133 is more than 50 nm, a total thickness of the semiconductor layer 130 may be increased so that it may be difficult to realize a thin profile of the display device. For example, in consideration of the properties of the supporting layer and thinness of the display device, the third oxide semiconductor layer 133 may have a thickness of 10 nm to 30 nm.

In a similar manner as the first oxide semiconductor layer 131 and the second oxide semiconductor layer 132, the third oxide semiconductor layer 133 may be formed by metal-organic chemical vapor deposition (MOCVD). In this case, the third oxide semiconductor layer 133, the first oxide semiconductor layer 131, and the second oxide semiconductor layer 132 may be sequentially formed without a vacuum braking step.

Figure 3:
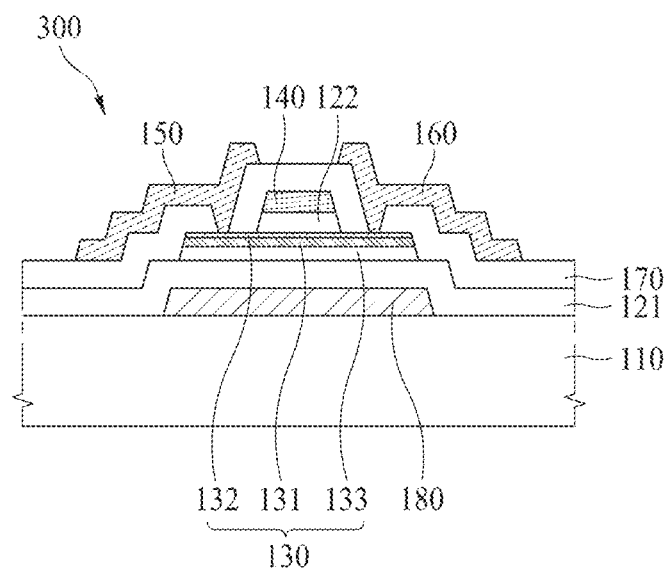
FIG. 3 is a cross-sectional view illustrating a thin-film transistor according to another embodiment of the present disclosure.

FIG. 3 is a cross-sectional view illustrating a thin-film transistor according to another embodiment of the present disclosure.

In comparison with the thin-film transistor 200 shown in the FIG. 2 example, a thin-film transistor 300 shown in the FIG. 3 example may further include a light-shielding layer 180 between a base substrate 110 and a buffer layer 121. The light-shielding layer 180 may overlap a semiconductor layer 130.

The light-shielding layer 180 may block light, which may be incident on the semiconductor layer 130 of the thin-film transistor 300 from an external environment, to thereby reduce or prevent the semiconductor layer 130 from being damaged by the externally-provided light. The light-shielding layer 180 may include an electrically conductive material, such as metal. The buffer layer 121 may insulate the light-shielding layer 180 and the semiconductor layer 130 from each other. The light-shielding layer 180 may be electrically connected to any one of a source electrode 150 and a drain electrode 160.

Figure 4A:
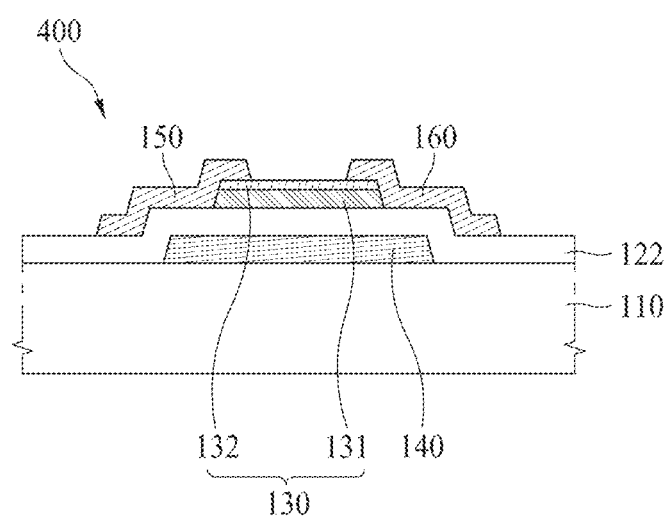
FIG. 4A is a cross-sectional view illustrating a thin-film transistor according to another embodiment of the present disclosure.

FIG. 4A is a cross-sectional view illustrating a thin-film transistor 400 according to another embodiment of the present disclosure.

The thin-film transistor 400 of FIG. 4A may include a base substrate 110, a gate electrode 140 on the base substrate 110, and a semiconductor layer 130 spaced apart from the gate electrode 140 and partially overlapping the gate electrode 140. Also, the thin-film transistor 400 may include a gate insulating layer 122 between the gate electrode 140 and the semiconductor layer 130, a source electrode 150 connected to the semiconductor layer 130, and a drain electrode 160 spaced apart from the source electrode 150 and connected to the semiconductor layer 130.

With reference to FIG. 4A, the semiconductor layer 130 may include a first oxide semiconductor layer 131 and a second oxide semiconductor layer 132. The first oxide semiconductor layer 131 and the second oxide semiconductor layer 132 may be sequentially disposed on the base substrate 110. Also, the gate electrode 140 may be between the semiconductor layer 130 and the base substrate 110, and the first oxide semiconductor layer 131 may be closer to the gate electrode 140, in comparison with the second oxide semiconductor layer 132.

As shown in the example of FIG. 4A, the structure in which the gate electrode 140 is disposed below the semiconductor layer 130 may be referred to as a "bottom-gate" structure. Herein, the semiconductor layer 130, the gate electrode 140, the source electrode 150, and the drain electrode 160 may constitute the thin-film transistor 400.

Figure 4B:
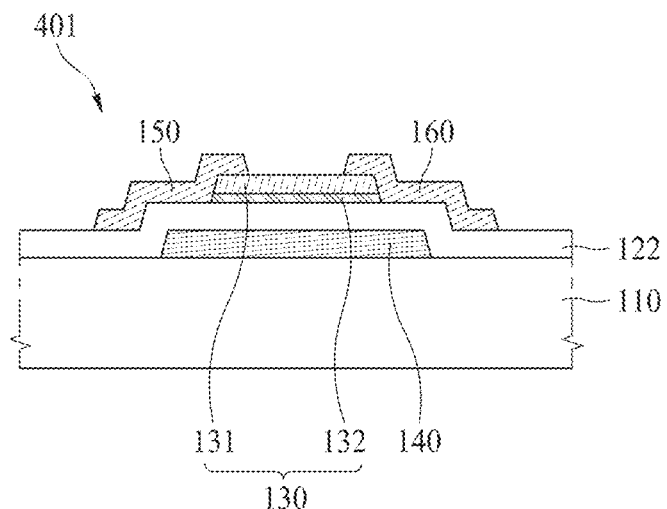
FIG. 4B is a cross-sectional view illustrating a thin-film transistor according to another embodiment of the present disclosure.

FIG. 4B is a cross-sectional view illustrating a thin-film transistor according to another embodiment of the present disclosure.

With reference to FIG. 4B, in a thin-film transistor 401, the semiconductor layer 130 may include a first oxide semiconductor layer 131 and a second oxide semiconductor layer 132. The second oxide semiconductor layer 132 and the first oxide semiconductor layer 131 may be sequentially disposed on the base substrate 110. In addition, the gate electrode 140 may be between the semiconductor layer 130 and the base substrate 110, and the second oxide semiconductor layer 131 may be closer to the gate electrode 140, in comparison with the first oxide semiconductor layer 132. In this case, the second oxide semiconductor layer 132 may protect the first oxide semiconductor layer 131, and may function as an interfacial channel layer.

Figure 5A:
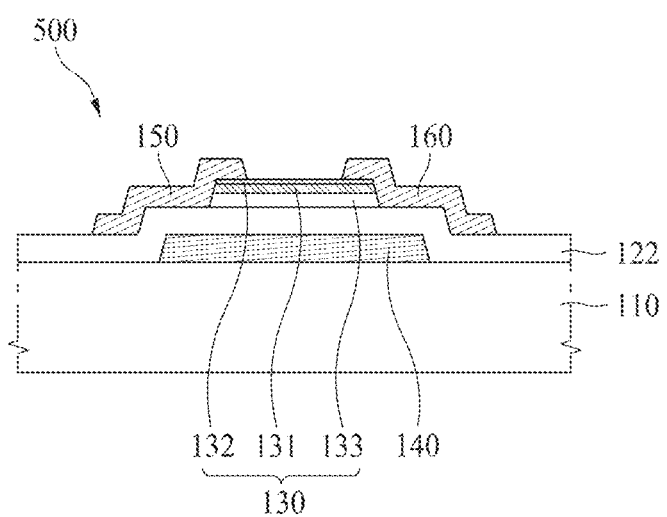
FIG. 5A is a cross-sectional view illustrating a thin-film transistor according to another embodiment of the present disclosure.

FIG. 5A is a cross-sectional view illustrating a thin-film transistor according to another embodiment of the present disclosure.

In case of a thin-film transistor 500 shown in the example of FIG. 5A, in comparison with the thin-film transistor 400 shown in the example of FIG. 4A, a semiconductor layer 130 may further include a third oxide semiconductor layer 133. With reference to FIG. 5A, as shown in the drawing, the third oxide semiconductor layer 133 may be below a first oxide semiconductor layer 131. Thus, the first oxide semiconductor layer 131 may be between the second oxide semiconductor layer 132 and the third oxide semiconductor layer 133.

According to one embodiment of the present disclosure, the third oxide semiconductor layer 133 may serve as a supporting layer for supporting the first oxide semiconductor layer 131 corresponding to a main channel layer. The third oxide semiconductor layer 133 serving as the supporting layer may have good film stability and good mechanical properties. For good film stability, the third oxide semiconductor layer 133 may include gallium (Ga).

Figure 5B:
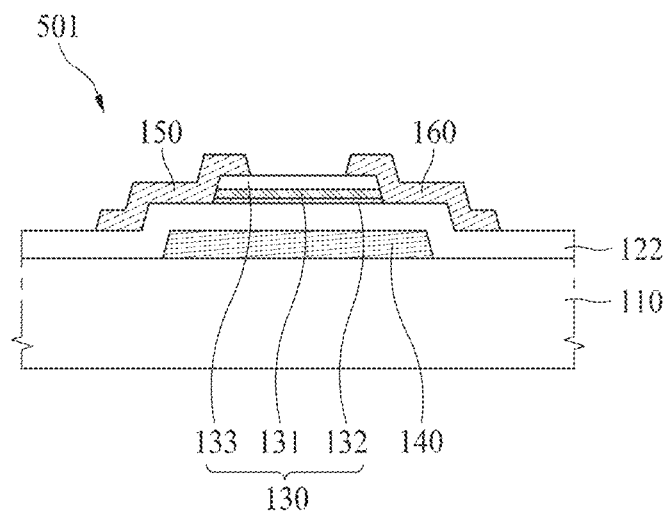
FIG. 5B is a cross-sectional view illustrating a thin-film transistor according to another embodiment of the present disclosure.

FIG. 5B is a cross-sectional view illustrating a thin-film transistor according to another embodiment of the present disclosure.

In a thin-film transistor 501 shown in the example of FIG. 5B, in comparison with the thin-film transistor 401 shown in the example of FIG. 4B, the semiconductor layer 130 may further include a third oxide semiconductor layer 133. With reference to FIG. 5B, the third oxide semiconductor layer 133 may be over the first oxide semiconductor layer 131. Thus, the first oxide semiconductor layer 131 may be between the second oxide semiconductor layer 132 and the third oxide semiconductor layer 133.

According to one embodiment of the present disclosure, the third oxide semiconductor layer 133 may serve as a supporting layer for supporting the first oxide semiconductor layer 131 corresponding to a main channel layer. The third oxide semiconductor layer 133 serving as the supporting layer may have good film stability and good mechanical properties. For good film stability, the third oxide semiconductor layer 133 may include gallium (Ga).

Figure 6A:
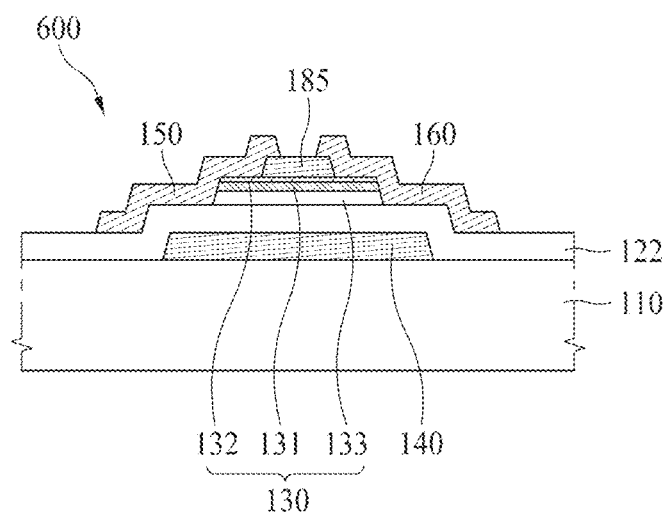
FIG. 6A is a cross-sectional view illustrating a thin-film transistor according to another embodiment of the present disclosure.

FIG. 6A is a cross-sectional view illustrating a thin-film transistor according to another embodiment of the present disclosure.

In comparison with the thin-film transistor 500 shown in the FIG. 5A example, a thin-film transistor 600 shown in the FIG. 6A example may further include an etch stopper 185 on a semiconductor layer 130. The etch stopper 185 may include an insulating material. The etch stopper 185 may be on a second oxide semiconductor layer 132, to thereby protect a channel region. Accordingly, the semiconductor layer 130 according to one embodiment of the present disclosure may be applied to the thin-film transistor 600 having an etch stopper structure.

Figure 6B:
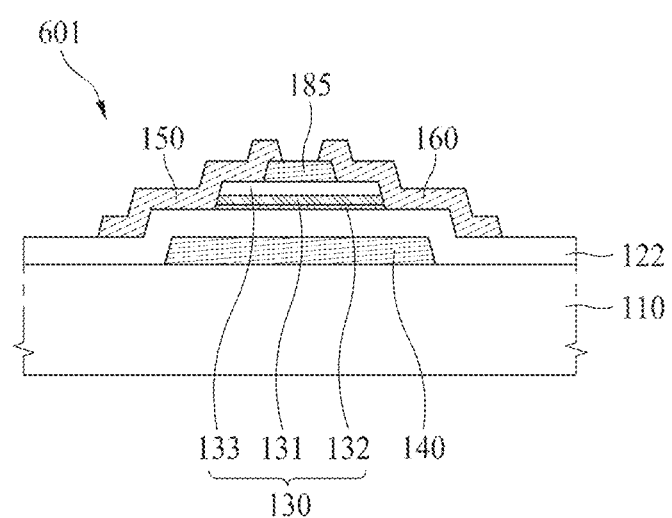
FIG. 6B is a cross-sectional view illustrating a thin-film transistor according to another embodiment of the present disclosure.

FIG. 6B is a cross-sectional view illustrating a thin-film transistor according to another embodiment of the present disclosure.

In comparison with the thin-film transistor 501 shown in the FIG. 5B example, a thin-film transistor 601 shown in the FIG. 6B example may further include an etch stopper 185 on a semiconductor layer 130. The etch stopper 185 may include an insulating material. The etch stopper 185 may be on the third oxide semiconductor layer 133 to protect a channel region.

Figure 7:
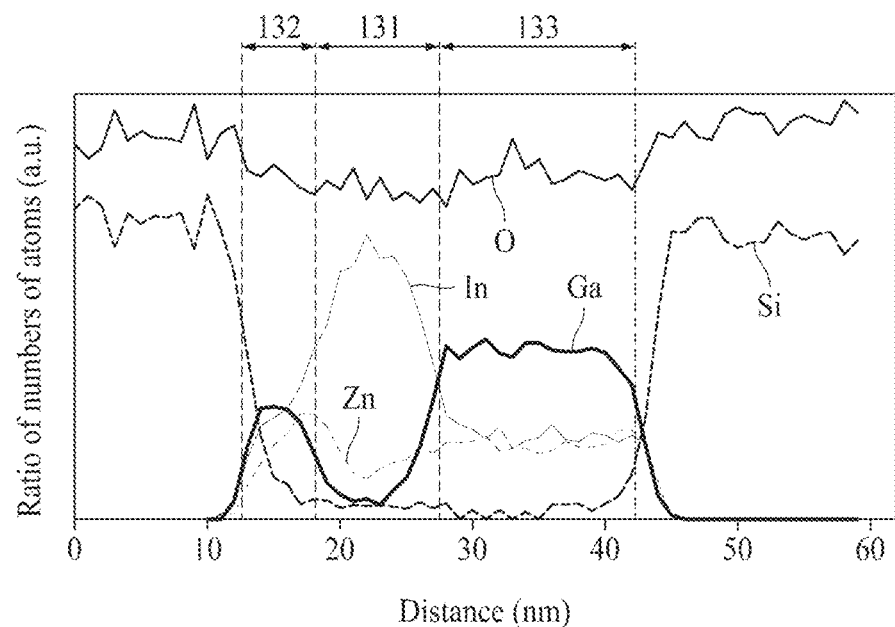
FIG. 7 is a graph illustrating a ratio of a number atoms of each element included in a thin-film transistor according to another embodiment of the present disclosure.

FIG. 7 is a graph illustrating a ratio of number of atoms of each element included in a thin-film transistor according to another embodiment of the present disclosure.

For example, FIG. 7 shows results obtained by analyzing some areas of the thin-film transistor 200 shown in FIG. 2 using energy dispersive X-ray spectrometer (EDS). The energy dispersive X-ray spectrometer (EDS) analyzes components for each sample provided to an electron microscope. The energy dispersive X-ray spectrometer (EDS) analyzes components of specimen using specific X-ray among various signals generated when a high-energy electron beam reacts on the specimen.

In the x-axis of FIG. 7, "Distance" indicates a distance from an upper surface of the gate insulating layer 122 toward the base substrate 110. For example, the x-axis indicates a distance from the upper surface (e.g., where Distance=0) of the gate insulating layer 122 toward a lower side along a thickness direction. From the (Distance=0) corresponding to a left side along the x-axis direction, each area corresponds to the gate insulating layer 122, the second oxide semiconductor layer 132, the first oxide semiconductor layer 131, the third oxide semiconductor layer 133, and the buffer layer 121. The y-axis of FIG. 7 represents a ratio of number of atoms of each element, which corresponds to an atom % (at %) of each element.

According to another embodiment of the present disclosure, the first oxide semiconductor layer 131, the second oxide semiconductor layer 132 and the third oxide semiconductor layer 133 may include an IGZO (InGaZnO)-based oxide semiconductor material. With reference to FIG. 7, the second oxide semiconductor layer 132 and the third oxide semiconductor layer 133 include a relatively large amount of gallium (Ga), and the first oxide semiconductor layer 131 may include a relatively large amount of indium (In).

Figure 8:
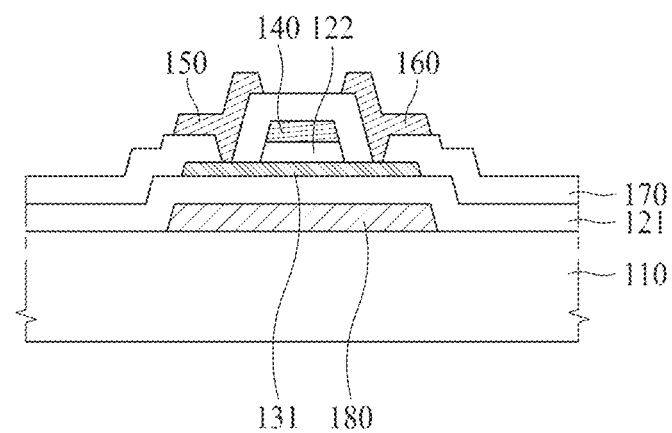
FIG. 8 is a cross-sectional view illustrating a thin-film transistor according to a Comparative Example.

FIG. 8 is a cross-sectional view illustrating a thin-film transistor according to a Comparative Example.

The thin-film transistor according to the Comparative Example shown in FIG. 8 may include a semiconductor layer, which is provided only with a first oxide semiconductor layer 131 functioning as a main channel layer. For example, the thin-film transistor of FIG. 8 is similar in structure to the thin-film transistor 300 of FIG. 3. However, the thin-film transistor of FIG. 8 includes the semiconductor layer 130 provided only with the first oxide semiconductor layer 131. The first oxide semiconductor layer 131 corresponding to the channel layer is formed of an IGZO (In:Ga:Zn=1:1:1)-based oxide semiconductor material, and the first oxide semiconductor layer 131 has a thickness of 12 nm.

Figure 9A:
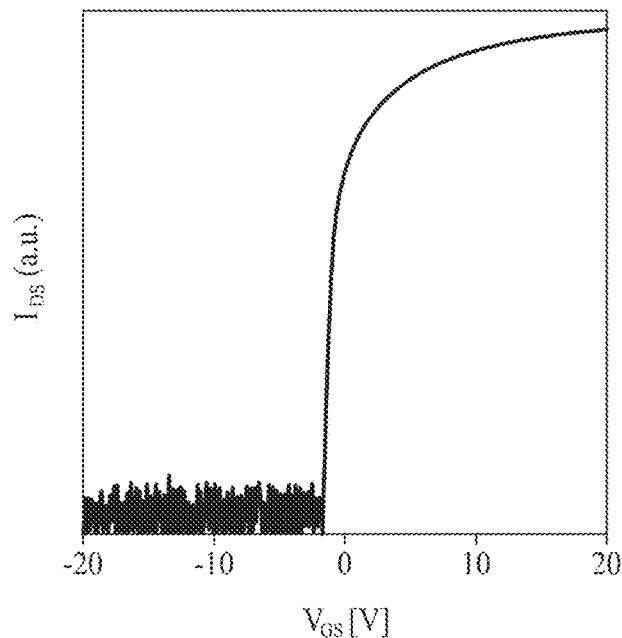
FIGS. 9A, 9B, and 9C are graphs illustrating experimental results of a threshold voltage of each thin-film transistor.
Figure 9B:
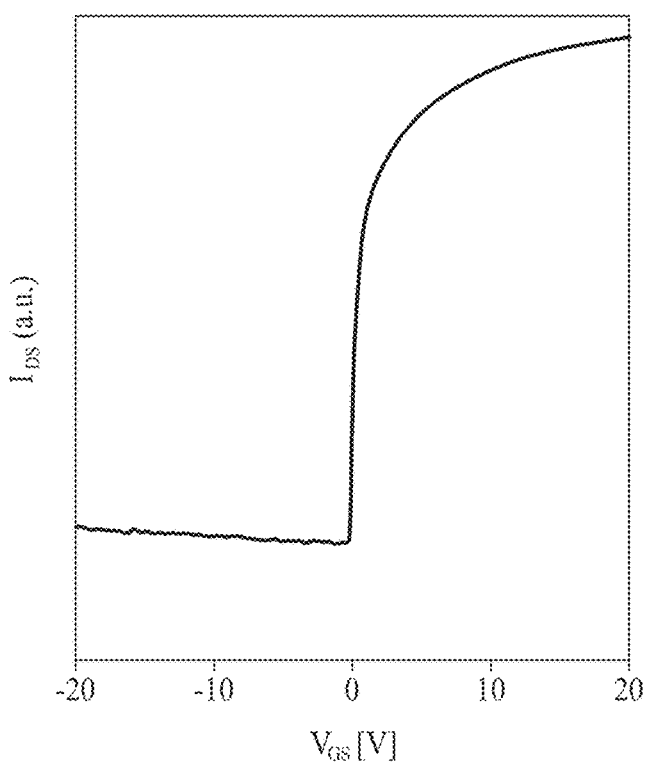
Figure 9C:
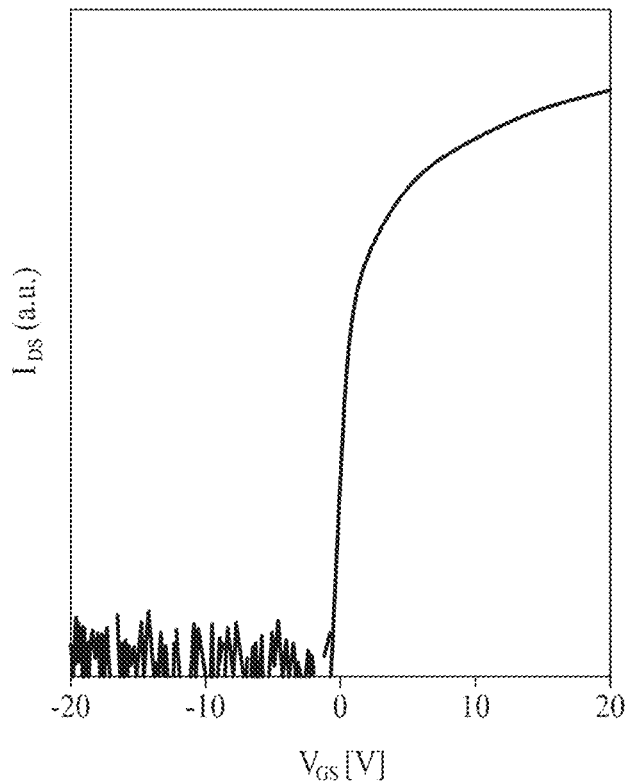

FIGS. 9A, 9B, and 9C are graphs illustrating experimental results of a threshold voltage of each thin-film transistor.

The example of FIG. 9A is a graph illustrating a threshold voltage in the thin-film transistor of the Comparative Example shown in FIG. 8. The example of FIG. 9B is a graph illustrating a threshold voltage in the thin-film transistor 200 shown in the example embodiment of FIG. 2. The example of FIG. 9C is a graph illustrating a threshold voltage in the thin-film transistor 500 shown in the example embodiment of FIG. 5.

The threshold voltage graph of FIGS. 9A, 9B, and 9C may be expressed as a current ($I_{DS}$) between the source electrode 150 and the drain electrode 160 in accordance with a voltage ($V_{GS}$) between the gate electrode 140 and the source electrode 150. In FIGS. 9A, 9B, and 9C, the current ($I_{DS}$) between the source electrode 150 and the drain electrode 160 is expressed as an arbitrary unit (a.u.).

With reference to FIG. 9A, the thin-film transistor of the Comparative Example, which includes the semiconductor layer provided only with the first oxide semiconductor layer 131, has the good threshold voltage properties. In FIG. 9A, a threshold voltage (Vth) is −0.9 V, Hall mobility is 54.8 $cm^2/V \cdot s$, and a positive bias temperature stress (PBTS) is 2.5 V.

The PBTS indicates a stress under the condition that a positive (+) bias voltage and a constant temperature are applied, and the PBTS generally has a positive (+) value. If the PBTS becomes large, a stress of the oxide semiconductor layer 120 or thin-film transistor 100 is increased, whereby a change of threshold voltage (ΔVth) may be increased.

FIG. 9B is a graph illustrating a threshold voltage in the thin-film transistor 200 shown in the FIG. 2 example. With reference to FIG. 2 and FIG. 9B, even though the second oxide semiconductor layer 132 (3 nm thickness) and the third oxide semiconductor layer 133 (15 nm thickness) are at both sides of the first oxide semiconductor layer 131, the threshold voltage properties are not deteriorated in comparison with the Comparative Example.

In FIG. 9B, a threshold voltage (Vth) is 0.21 V, Hall mobility is 59.22 $cm^2/V \cdot s$, and a positive bias temperature stress (PBTS) is 0.98 V. With reference to FIG. 9B, the thin-film transistor 200 shown in the FIG. 2 example has good threshold voltage properties, and great PBTS properties.

FIG. 9C is a graph illustrating a threshold voltage in the thin-film transistor 500 shown in the FIG. 5 example. With reference to FIG. 9C, even though the second oxide semiconductor layer 132 (3 nm thickness) and the third oxide semiconductor layer 133 (15 nm thickness) are at both sides of the first oxide semiconductor layer 131, the threshold voltage properties are not deteriorated. In FIG. 9C, a threshold voltage (Vth) is 0.94 V, and Hall mobility is 54.54 $cm^2/V \cdot s$.

As discussed above, if the first oxide semiconductor layer 131 having a particular thickness, which corresponds to the protection layer having high resistance, is on the second oxide semiconductor layer 132 corresponding to the main channel layer, the channel properties of the semiconductor layer 130 may not be deteriorated. Meanwhile, one of causes for deteriorating the function of the thin-film transistor 100, 200, 300, 400, 500, and 600 may be an electron trap by the insulating layer.

For example, the electron of the semiconductor layer 130 may be trapped by the gate insulating layer 122 due to defects existing in the gate insulating layer 122. For example, a defect state may be generated in the gate insulating layer 122, e.g., due to excess oxygen or a metal-to-metal bond, and the electron of the semiconductor layer 130 may be trapped in the defect position of the gate insulating layer 122. If the electron of the semiconductor layer 130 is trapped by the gate insulating layer 122, the electrical properties or switching properties of the thin-film transistor may be deteriorated.

Figure 10:
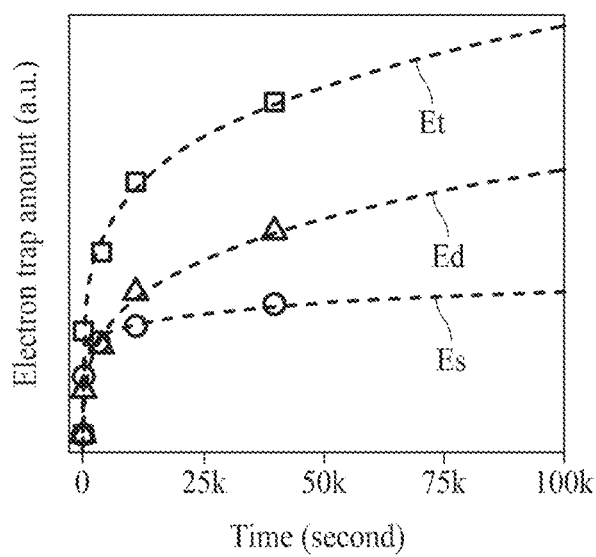
FIG. 10 is a graph illustrating an electron trap amount by a gate insulating layer.

FIG. 10 is a graph illustrating an electron trap amount by the gate insulating layer.

In FIG. 10, the electron trap amount is relatively expressed in accordance with time (e.g., second) if the first oxide semiconductor layer 131 including the high-density carrier (e.g., electron) is in direct contact with the gate insulating layer 122. In FIG. 10, "Es" indicates an electron trap amount in a surface area (10% area in a total thickness of the gate insulating layer) of the gate insulating layer 122, "Ed" indicates an electron trap amount in the remaining areas other than the surface area of the gate insulating layer 122, and "Et" indicates a total electron trap amount (e.g., Et=Es+Ed).

With reference to FIG. 10, the electron trap is generally generated in the surface area of the gate insulating layer 122 for an initial period. Thus, an initial reliability deterioration of the thin-film transistor may be caused by the defect existing in the surface area of the gate insulating layer 122.

Meanwhile, an amount of the electron trap may be saturated in the surface area of the gate insulating layer 122 after the lapse of time, and the electron trap may be generated in other areas of the gate insulating layer 122. Thus, a long-term reliability deterioration may be caused by the defect existing in the entire areas of the gate insulating layer 122.

Figure 11:
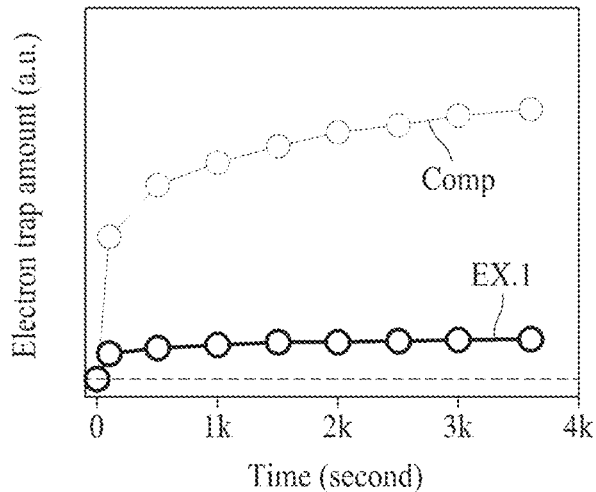
FIG. 11 is a graph illustrating an electron trap amount in a thin-film transistor according to one embodiment of the present disclosure, and an electron trap amount in a thin-film transistor according to a Comparative Example.

FIG. 11 is a graph illustrating an electron trap amount in the thin-film transistor according to one embodiment of the present disclosure, and an electron trap amount in the thin-film transistor according to the Comparative Example.

For example, "EX. 1" of FIG. 11 is a graph illustrating an electron trap amount generated by the gate insulating layer 122 of the thin-film transistor 100 shown in the example embodiment of FIG. 1, and "Comp" of FIG. 11 is a graph illustrating an electron trap amount generated by the gate insulating layer 122 of the thin-film transistor according to the Comparative Example shown in FIG. 8. In the thin-film transistor 100 of the FIG. 1 example, the second oxide semiconductor layer 132 of the high resistance serving as the protection layer may function as a barrier for the electron transfer. Thus, the second oxide semiconductor layer 132 on the first oxide semiconductor layer 131 reduce or prevent the electron of the second oxide semiconductor layer 132 from being transferred to the gate insulating layer 122. As a result, it may be possible to reduce or prevent the electron trap by the gate insulating layer 122. With reference to FIG. 11, it is known that the electron trap amount (EX. 1) generated in the thin-film transistor 100 of FIG. 1 is reduced in comparison with the electron trap amount (Comp.) generated in the thin-film transistor according to the Comparative Example.

Meanwhile, in the thin-film transistors according to the embodiments of the present disclosure, the semiconductor layer 130 may have a deposition structure. In the boundary area between the deposited two oxide semiconductor layers, a mixture area may be generated by mixture of components constituting each oxide semiconductor layer. The mixture area may be defined as the area formed by mixing the components of the neighboring two layers. According to one embodiment of the present disclosure, a thickness of the mixture area generated in the boundary area between the two oxide semiconductor layers may be be 3 nm or less. For example, the thickness of the mixture area may be 1 nm or less.

According to one embodiment of the present disclosure, a first mixture area may be generated between the first oxide semiconductor layer 131 and the second oxide semiconductor layer 132. For example, the thin-film transistor 100, 200, 300, 400, 500, and 600 according to one embodiment of the present disclosure may include the first mixture area between the first oxide semiconductor layer 131 and the second oxide semiconductor layer 132.

The first mixture area may be a layer obtained by mixing the components of the first oxide semiconductor layer 131 with the components of the second oxide semiconductor layer 132. A range of the first mixture area may be defined by a density. For example, between the first oxide semiconductor layer 131 and the second oxide semiconductor layer 132, a layer having a density value between a density value of the first oxide semiconductor layer 131 and a density value of the second oxide semiconductor layer 132 may be the first mixture area between the first oxide semiconductor layer 131 and the second oxide semiconductor layer 132.

Figure 12:
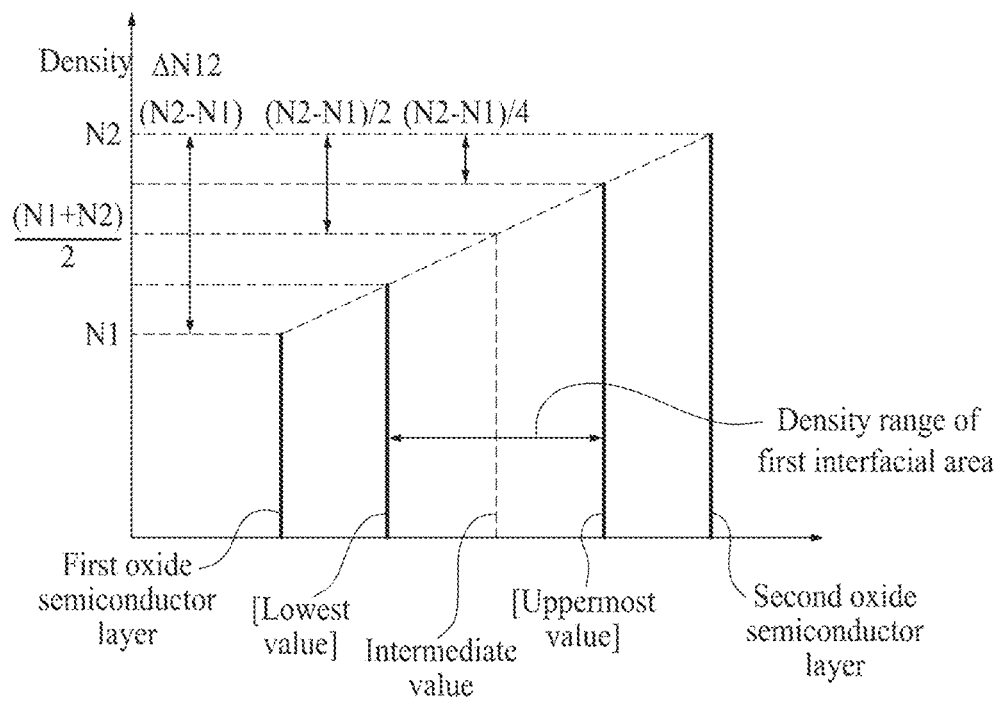
FIG. 12 is a view illustrating a method of defining a first mixture area.

FIG. 12 is a view illustrating a method of defining the first mixture area.

With reference to FIG. 12, when a density of the first oxide semiconductor layer 131 is "N1" and a density of the second oxide semiconductor layer 132 is "N2", an intermediate value of the density is "(N1+N2)/2", and a density difference is "(N2−N1)" or "(N1−N2)". FIG. 12 shows a case in which "N2" corresponding to the density of the second oxide semiconductor layer 132 is larger than "N1" corresponding to the density of the first oxide semiconductor layer 131.

According to one embodiment of the present disclosure, a value obtained by subtracting a value corresponding to 25% of "(N2−N1)" corresponding to the density difference between the first oxide semiconductor layer 131 and the second oxide semiconductor layer 132 from the intermediate value "(N1+N2)/2" of the density between "N1" corresponding to the density of the first oxide semiconductor layer 131 and "N2" corresponding to the density of the second oxide semiconductor layer 132 is defined as a lowest value of the density in the first mixture area, and a value obtained by adding the value corresponding to 25% of "(N2−N1)" corresponding to the density difference between the first oxide semiconductor layer 131 and the second oxide semiconductor layer 132 to the intermediate value "(N1+N2)/2" of the density between "N1" corresponding to the density of the first oxide semiconductor layer 131 and "N2" corresponding to the density of the second oxide semiconductor layer 132 is defined as an uppermost value of the density in the first mixture area. As a result, a density range of the first mixture area is shown in the following Equation 1.

$$(3 \times N1+N2)/4 \leq \text{density of the first mixture area} \leq (N1+3 \times N2)/4. \quad \text{[Equation 1]}$$

Meanwhile, if "N2" corresponding to the density of the second oxide semiconductor layer 132 is smaller than "N1" corresponding to the density of the first oxide semiconductor layer 131, a density range of the first mixture area is shown in the following Equation 2.

$$(N1+3 \times N2)/4 \leq \text{density of the first mixture area} \leq (3 \times N1+N2)/4. \quad \text{[Equation 2]}$$

Accordingly, in the area between the first oxide semiconductor layer 131 and the second oxide semiconductor layer 132, the area having the density range of Equation 1 or Equation 2 may be referred to as the "first mixture" area.

As shown in the above Equations 1 and 2, when the density of the first oxide semiconductor layer 131 is "N1" and the density of the second oxide semiconductor layer 132 is "N2", the first mixture area may be defined as the area having a density between [(3×N1+N2)/4] and [(N1+3×N2)/4], the area having a density of [(3×N1+N2)/4], and the area having a density of [(N1+3×N2)/4]. For example, the density range of the first mixture area between the first oxide semiconductor layer 131 and the second oxide semiconductor layer 132 may include any of: a density between [(3×N1+N2)/4] and [(N1+3×N2)/4], a density of [(3×N1+N2)/4], and a density of [(N1+3×N2)/4].

If the semiconductor layer 130 may further include a third oxide semiconductor layer 133, the thin-film transistor 200, 300, 500, and 600 may include a second mixture area between the first oxide semiconductor layer 131 and the third oxide semiconductor layer 132. The second mixture area may be the layer obtained by mixing the components of the first oxide semiconductor layer 131 and the components of the third oxide semiconductor layer 133.

According to one embodiment of the present disclosure, the second mixture area may be defined a density. The second mixture area may be defined as the area having any of: a density between [(3×N1+N3)/4] and [(N1+3×N3)/4], a density of [(3×N1+N3)/4], and a density of [(N1+3×N3)/4].

According to one embodiment of the present disclosure, a thickness of the first mixture area may be 3 nm or less. For example, the thickness of the first mixture area may be 1 nm or less. According to one embodiment of the present disclosure, to realize the thickness of 3 nm or less, and more particularly, the thickness of 1 nm or less in the first mixture area provided between the first oxide semiconductor layer 131 and the second oxide semiconductor layer 132, the first oxide semiconductor layer 131 and the second oxide semiconductor layer 132 may include metal-organic chemical vapor deposition (MOCVD).

As the thickness of the first mixture area is reduced or minimized to 3 nm or less, and more particularly, 1 nm or less, it may be possible to reduce or minimize a loss of thickness in each layer of the first oxide semiconductor layer 131 and the second oxide semiconductor layer 132 after forming the first oxide semiconductor layer 131 and the second oxide semiconductor layer 132. Thus, even though the first oxide semiconductor layer 131 and the second oxide semiconductor layer 132 may have the small thickness for a manufacturing process, it may be possible to maintain the structure and function in the first oxide semiconductor layer 131 and the second oxide semiconductor layer 132. Also, each of the first oxide semiconductor layer 131 and the second oxide semiconductor layer 132 may perform its own function under the condition that a mutual interference between the first oxide semiconductor layer 131 and the second oxide semiconductor layer 132 is reduced or minimized.

The second mixture area may be formed between the first oxide semiconductor layer 131 and the third oxide semiconductor layer 133. According to another embodiment of the present disclosure, a thickness of the second mixture area may be 3 nm or less, and more particularly, may be 1 nm or less.

As the thickness of the second mixture area is reduced or minimized to 3 nm or less, and more particularly, 1 nm or less, it may be possible to reduce or minimize a loss of thickness in each layer of the first oxide semiconductor layer 131 and the third oxide semiconductor layer 133 after forming the first oxide semiconductor layer 131 and the third oxide semiconductor layer 133. Thus, even though the first oxide semiconductor layer 131 and the third oxide semiconductor layer 133 may have the small thickness for a manufacturing process, it may be possible to maintain the structure and function in the first oxide semiconductor layer 131 and the third oxide semiconductor layer 133. Also, each of the first oxide semiconductor layer 131 and the third oxide semiconductor layer 133 may perform its own function.

According to one embodiment of the present disclosure, the gate insulating layer 122 between the semiconductor layer 130 and the gate electrode 140 may include an $SiO_2$-based oxide including silicon and oxygen. According to one embodiment of the present disclosure, the gate insulating layer 122 may be a high-density $SiO_2$-based oxide layer. In comparison with a low-density $SiO_2$-based oxide layer, the high-density $SiO_2$-based oxide layer may include a relatively small amount of hydrogen (H), and may have a relatively high $SiO_2$ bond rate. According to one embodiment of the present disclosure, the gate insulating layer 122 may include hydrogen (H) of 2 atom % or less in comparison with a total number of atoms of the gate insulating layer 122.

Also, the gate insulating layer 122 may include a silicon (Si) bond. The silicon (Si) bond may include a $SiO_4$ bond, a $SiO_2$ bond, and a Si—OH bond. In the total silicon bond of the gate insulating layer 122, the $SiO_2$ bond may occupy 95% or more, and the Si—OH bond may occupy 2% or less.

According to one embodiment of the present disclosure, the $SiO_2$-based oxide layer including the hydrogen content of 2 atom % or less and having the $SiO_2$ bond of 95% or more in comparison with the total silicon bond may be referred to as the "high-density $SiO_2$-based oxide layer." The $SiO_2$-based oxide layer including the hydrogen content more than 2 atom % and having the $SiO_2$ bond less than 95% in comparison with the total silicon bond may be referred to as the "low-density $SiO_2$-based oxide layer."

Figure 13:
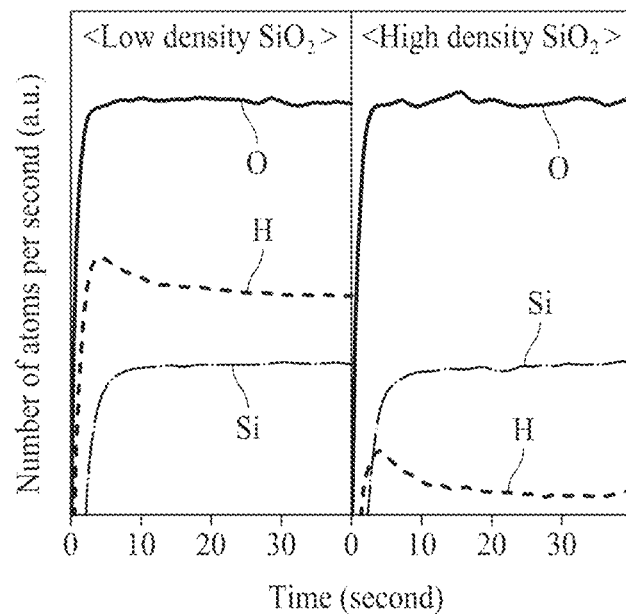
FIG. 13 is a graph comparing composition ratios of components included in a low-density $SiO_2$ film and in a high-density $SiO_2$ film.

FIG. 13 is a graph illustrating a comparison result showing a composition for components included in a low-density $SiO_2$ layer and a composition for components included in a high-density $SiO_2$ layer.

The graph of FIG. 13 is measured by a secondary ion mass spectrometry (SIMS). With reference to FIG. 13, in comparison with the low-density $SiO_2$-based oxide layer, the high-density $SiO_2$-based oxide layer may include a relatively small amount of hydrogen (H).

If the high-density $SiO_2$-based oxide layer including a relatively small amount of hydrogen (H) is used for the gate insulating layer 122, it may be possible to reduce or prevent hydrogen (H) from being permeated into the first oxide semiconductor layer 131 functioning as the main channel layer, to thereby reduce or prevent the electrical properties of the first oxide semiconductor layer 131 from being deteriorated. Also, if the high-density $SiO_2$-based oxide layer including a relatively small amount of hydrogen (H) is used for the gate insulating layer 122, the defect state of the gate insulating layer 122 may be reduced. As a result, it may be possible to restrict or prevent the electron of the semiconductor layer 130, for example, the electron of the first oxide semiconductor layer 131, from being trapped in the gate insulating layer 122.

Figure 14:
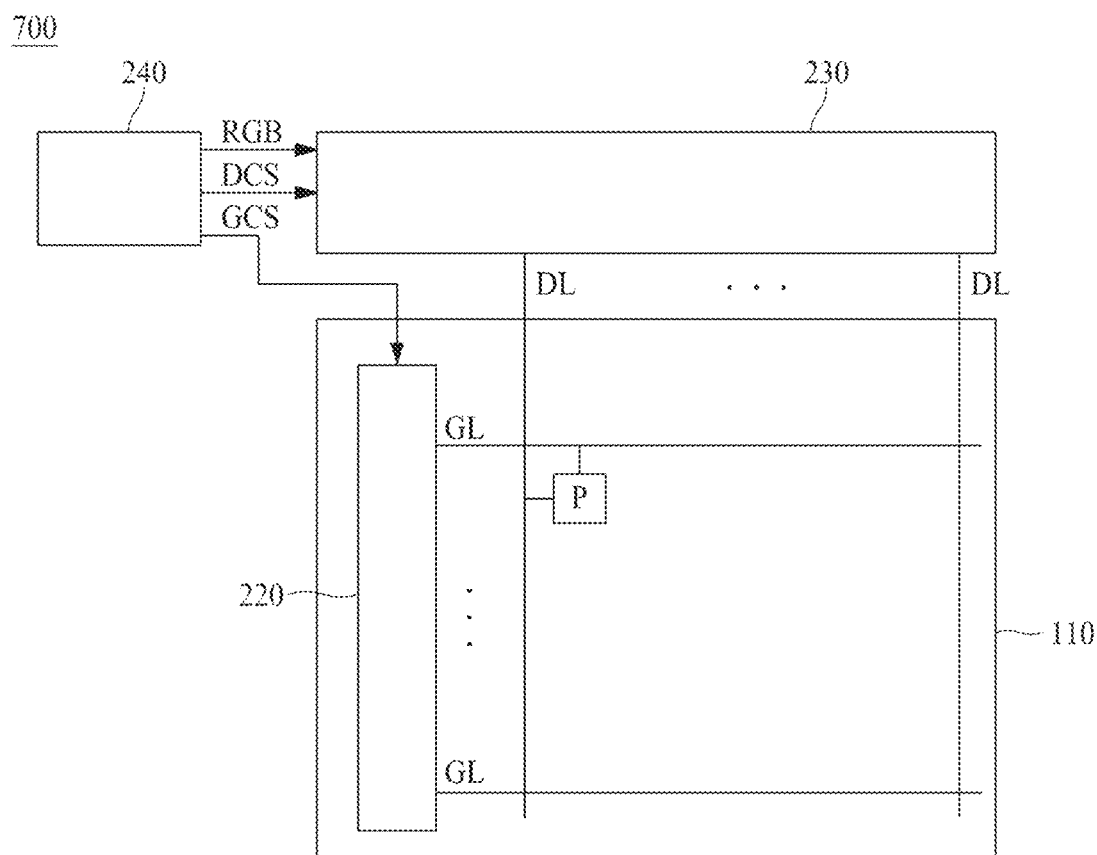
FIG. 14 is a view illustrating a display device according to another embodiment of the present disclosure.
Figure 15:
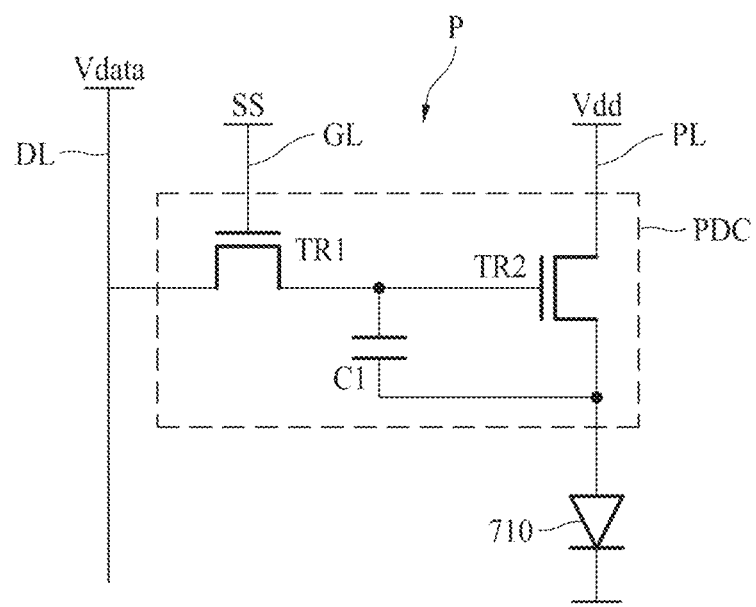
FIG. 15 is a circuit diagram illustrating any one pixel of FIG. 14.
Figure 16:
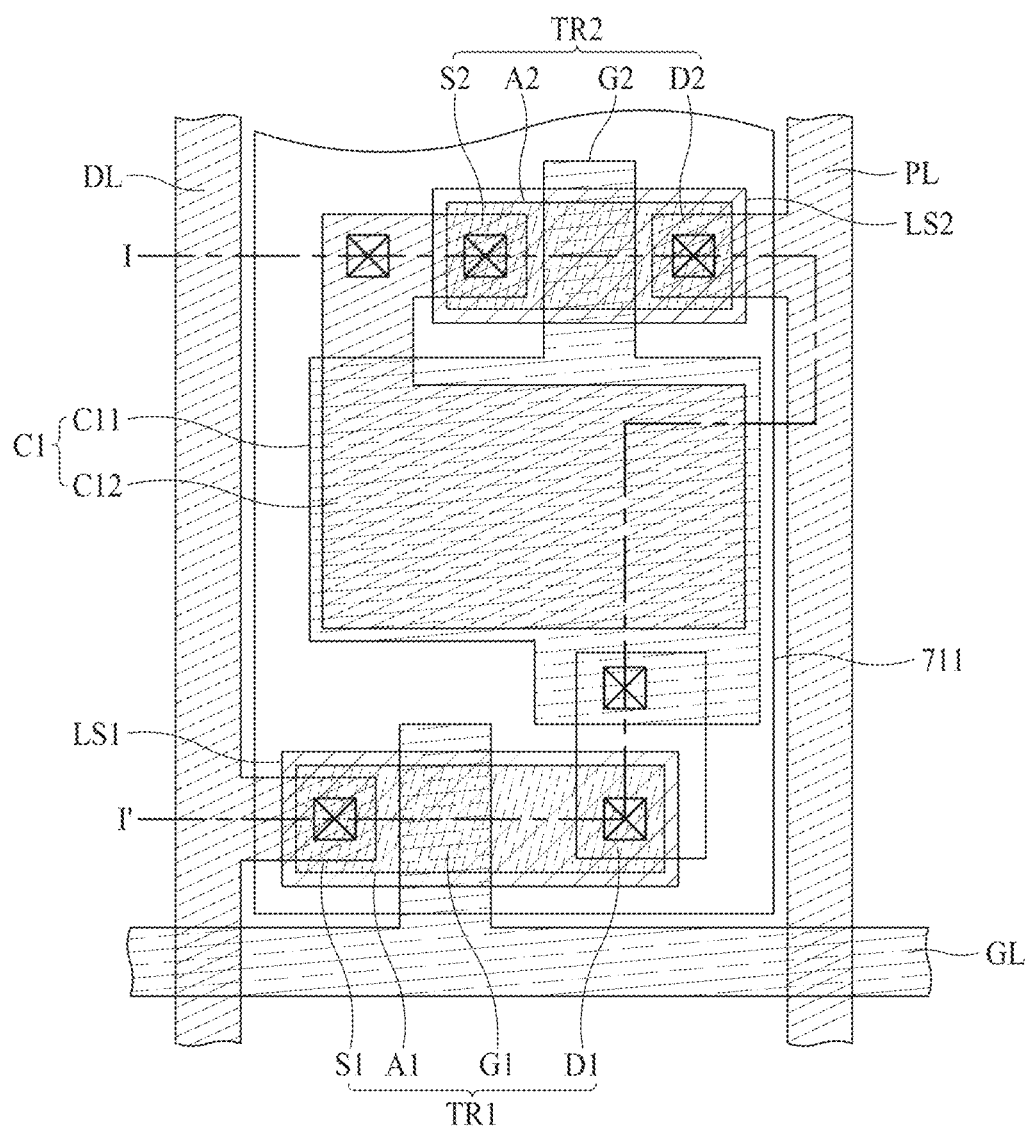
FIG. 16 is a plane view illustrating a pixel of FIG. 14.
Figure 17:
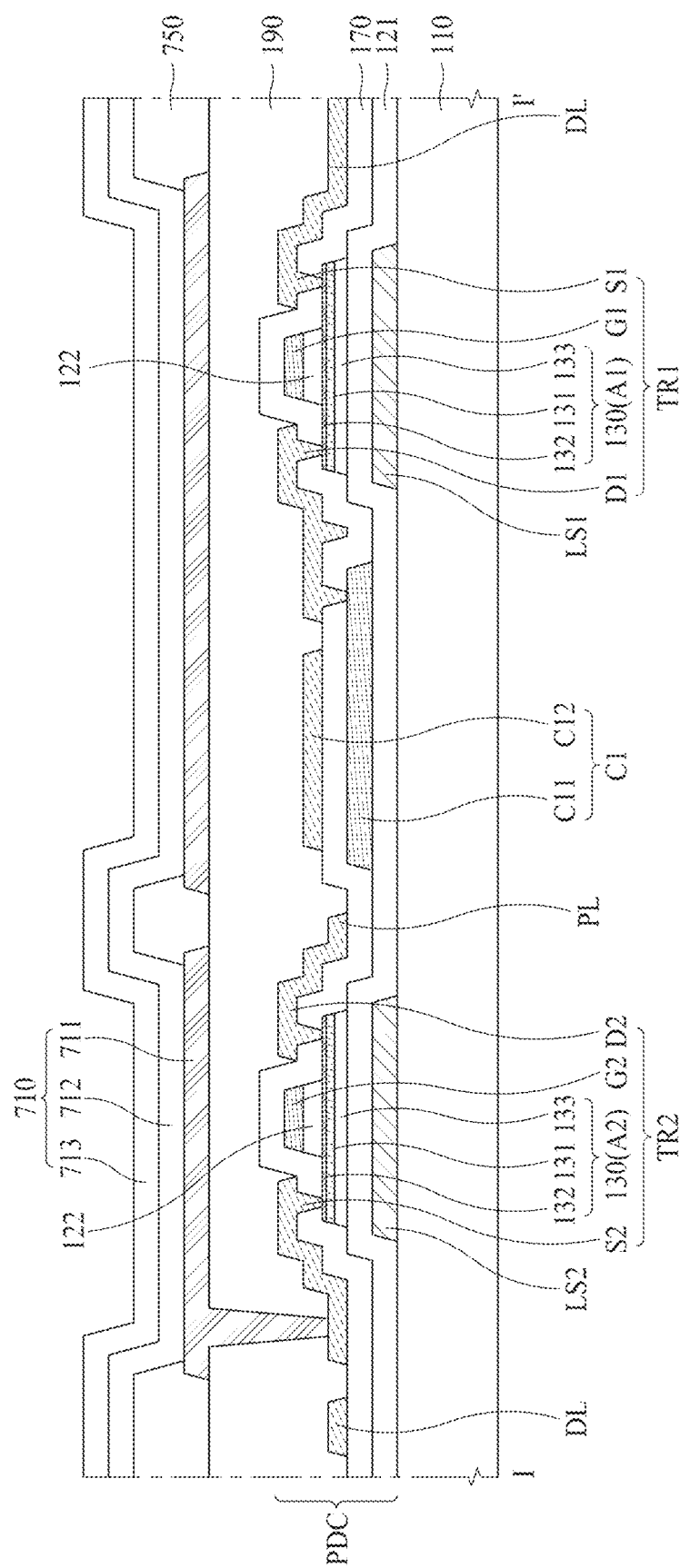
FIG. 17 is a cross-sectional view taken along line I-I' of FIG. 16.

FIG. 14 is a view illustrating a display device according to another embodiment of the present disclosure. FIG. 15 is a circuit diagram illustrating any one pixel of FIG. 14. FIG. 16 is a plane view illustrating a pixel of FIG. 14. FIG. 17 is a cross-sectional view taken along line I-I' of FIG. 16.

Hereinafter, a display device 700 according to another embodiment of the present disclosure will be described with reference to the examples of FIGS. 14 to 17. The display device 700 according to another embodiment of the present disclosure may include a base substrate 110, a pixel driving circuit (PDC) on the base substrate 110, and a display element 710 connected to the pixel driving circuit (PDC). The pixel driving circuit (PDC) may include a thin-film transistor. Any of the thin-film transistors 100, 200, 300, 400, 500, and 600 shown in the examples of FIGS. 1, 2, 3, 4, 5 and 6 may be used for the thin-film transistor. Thus, to avoid a repetitive explanation, a detailed description for the thin-film transistor included in the display device 700 will be omitted.

As shown in FIG. 14, the display device 700 according to another embodiment of the present disclosure may include a pixel (P), a gate driver 220, a data driver 230, and a controller 240 on a base substrate 110. On the base substrate 110, there may be gate lines (GL) and data lines (DL), and each pixel (P) may be arranged at a crossing portion of a gate line (GL) and a data line (DL). The pixel (P) may include a display element 710, and a pixel driving circuit (PDC) for driving the display element 710. An image may be displayed by driving the pixel (P).

The controller 240 may control the gate driver 220 and the data driver 230. The controller 240 may output a gate control signal (GCS) for controlling the gate driver 220 and a data control signal (DCS) for controlling the data driver 230 using vertically/horizontally synchronized signals and clock signals supplied from an external system (not shown). Also, the controller 240 may sample input video data, which may be provided from the external system, may then re-align the sampled video data, and may supply the re-aligned digital video data (RGB) to the data driver 230.

The gate control signal (GCS) may include a gate start pulse (GSP), a gate shift clock (GSC), a gate output enable signal (GOE), a start signal (Vst), and a gate clock (GCLK). Also, control signals for controlling a shift register may be included in the gate control signal (GCS). The data control signal (DCS) may include a source start pulse (SSP), a source shift clock signal (SSC), a source output enable signal (SOE), and a polarity control signal (POL).

The data driver 230 may supply a data voltage to the data lines (DL) on the base substrate 110. For example, the data driver 230 may convert the video data (RGB) provided from the controller 240 into an analog data voltage, and may supply the analog data voltage to the data lines (DL).

The gate driver 220 may sequentially supply a gate pulse (GP) to the gate lines (GL) for one frame period. Herein, "one frame" indicates the period in which one image is output through a display panel. Also, the gate driver 220 may supply a gate-off signal for turning off the switching device to the gate line (GL) for the remaining period of one frame in which the gate pulse (GP) is not supplied. Hereinafter, the gate pulse (GP) and the gate-off signal (Goff) may be collectively referred to as "scan signals (SS)."

According to one embodiment of the present disclosure, the gate driver 220 may be on the base substrate 110. A structure of directly providing the gate driver 220 on the base substrate 110 may be referred to as a "Gate-In-Panel (GIP)" structure.

The circuit diagram of FIG. 15 corresponds to an equivalent circuit diagram for one pixel (P) in a display device 100 including an organic light-emitting diode (OLED). A pixel driving circuit (PDC) of FIG. 15 may include a first thin-film transistor (TR1) corresponding to a switching transistor, and a second thin-film transistor (TR2) corresponding to a driving transistor. Any of the thin-film transistors 100, 200, 300, 400, 500, and 600 shown in the examples of FIGS. 1, 2, 3, 4, 5, and 6 may be used for the first thin-film transistor (TR1) and the second thin-film transistor (TR2).

The first thin-film transistor (TR1) may be connected to gate and data lines (GL, DL), and may be turned on or turned off by a scan signal (SS) supplied through the gate line (GL). The data line (DL) may provide a data voltage (Vdata) to the pixel driving circuit (PDC), and the first thin-film transistor (TR1) may control an application of the data voltage (Vdata).

A driving voltage line (PL) may provide a driving voltage (Vdd) to a display element 710, and the second thin-film transistor (TR2) may control the driving voltage (Vdd). The driving voltage (Vdd) may correspond to a pixel-driving voltage for driving the organic light-emitting diode (OLED) corresponding to the display element 710.

When the first thin-film transistor (TR1) is turned on by the scan signal (SS) applied from a gate driver 220 via the gate line (GL), the data voltage (Vdata) supplied via the data line (DL) may be supplied to a gate electrode (G2) of the second thin-film transistor (TR2) connected to the display element 710. The data voltage (Vdata) may be charged in a first capacitor (C1) provided between the gate electrode (G2) of the second thin-film transistor (TR2) and a source electrode (S2) of the second thin-film transistor (TR2). The first capacitor (C1) may correspond to a storage capacitor (Cst). The first capacitor (C1) may include a first capacitor electrode (C11) connected to the gate electrode (G2) of the second thin-film transistor (TR2), and a second capacitor electrode (C12) connected to the source electrode (S2) of the second thin-film transistor (TR2).

A supply amount of current supplied to the organic light-emitting diode (OLED) corresponding to the display element 710 through the second thin-film transistor (TR2) may be controlled in accordance with the data voltage (Vdata). Thus, it may be possible to control a grayscale of the light emitted from the display element 710.

With reference to FIGS. 16 and 17, the pixel driving circuit (PDC) may be on a base substrate 110. The base substrate 110 may include glass or plastic. For example, the base substrate 110 may include a transparent plastic material having flexibility, for example, polyimide (PI).

The pixel driving circuit (PDC) may include a light-shielding layer (LS1, LS2) on the base substrate 110, a buffer layer 121 on the light-shielding layer (LS1, LS2), a semiconductor layer (A1, A2) 130 on the buffer layer 121, a gate electrode (G1, G2) partially overlapping the semiconductor layer (A1, A2) 130, and a source electrode (S1, S2) and a drain electrode (D1, D2) connected to the semiconductor layer (A1, A2) 130. The light-shielding layer (LS1, LS2) may include an electrical conductive material, such as metal. The light-shielding layer (LS1, LS2) may have light-blocking properties. According to one embodiment of the present disclosure, the light-shielding layer (LS1, LS2) may block externally-provided light, to thereby protect the semiconductor layer 130.

The buffer layer 121 may be on the light-shielding layer (LS1, LS2). The buffer layer 121 may include an insulating material, and may protect the semiconductor layer 130 from externally-provided moisture or oxygen. The semiconductor layer (A1) of the first thin-film transistor (TR1) and the semiconductor layer (A2) of the second thin-film transistor (TR2) may be on the buffer layer 121. The semiconductor layer (A1, A2) 130 is described above, and a detailed description for the semiconductor layer (A1, A2) will be omitted.

At least one of the semiconductor layer (A1) of the first thin-film transistor (TR1) and the semiconductor layer (A2) of the second thin-film transistor (TR2) may include a first oxide semiconductor layer 131 on the buffer layer 121, and a second oxide semiconductor layer 132 on the first oxide semiconductor layer 131. At least one of the semiconductor layer (A1) of the first thin-film transistor (TR1) and the semiconductor layer (A2) of the second thin-film transistor (TR2) may further include a third oxide semiconductor layer 133 below the first oxide semiconductor layer 131.

With reference to FIG. 17, each of the semiconductor layer (A1) of the first thin-film transistor (TR1) and the semiconductor layer (A2) of the second thin-film transistor (TR2) may be formed in a structure including the third oxide semiconductor layer 133, the first oxide semiconductor layer 131 and the second oxide semiconductor layer 132 deposited in sequence. However, embodiments of the present disclosure are not limited to the above.

A gate insulating layer 122 may be on the semiconductor layer 130. The gate insulating layer 122 may have insulating properties.

The gate electrode (G1, G2) may be on the gate insulating layer 122. The gate electrode (G1, G2) may be the area extended from the gate line (GL), or may be some areas of the gate line (GL). An insulating interlayer 170 may be on the gate electrode (G1, G2).

The source electrode (S1, S2) and the drain electrode (D1, D2) may be on the insulating interlayer 170. According to one embodiment of the present disclosure, the source electrode (S1, S2) and the drain electrode (D1, D2) may be distinguished from each other for convenience of explanation. However, the source electrode (S1, S2) and the drain electrode (D1, D2) may be used interchangeably. Thus, the source electrode (S1, S2) may be the drain electrode (D1, D2), and the drain electrode (D1, D2) may be the source electrode (S1, S2).

According to one embodiment of the present disclosure, the source electrode (S1) and the drain electrode (D1) included in the first thin-film transistor (TR1) may be spaced apart from each other, and may be connected to the semiconductor layer (A1) of the first thin-film transistor (TR1). The source electrode (S2) and the drain electrode (D2) included in the second thin-film transistor (TR2) may be spaced apart from each other, and may be connected to the second oxide semiconductor layer 132 in the semiconductor layer (A2) of the second thin-film transistor (TR2).

Also, the data line (DL) and the driving power line (PL) may be on the insulating interlayer 170. According to one embodiment of the present disclosure, the source electrode (S1) of the first thin-film transistor (TR1) may be connected to the data line (DL). The drain electrode (D2) of the second thin-film transistor (TR2) may be connected to the driving power line (PL).

As shown in FIG. 17, the first thin-film transistor (TR1) may include the semiconductor layer (A1), the gate electrode (G1), the source electrode (S1), and the drain electrode (D1). The first thin-film transistor (TR1) may function as the switching transistor for controlling the data voltage (Vdata) applied to the pixel driving circuit (PDC).

The second thin-film transistor (TR2) may include the semiconductor layer (A2), the gate electrode (G2), the source electrode (S2), and the drain electrode (D2). The second thin-film transistor (TR2) may function as the driving transistor for controlling the driving voltage (Vdd) applied to the display element 710.

A planarization layer 190 may be on the source electrode (S1, S2), the drain electrode (D1, D2), the data line (DL), and the driving power line (PL). The planarization layer 190 may planarize an upper surface of the first thin-film transistor (TR1) and an upper surface of the second thin-film transistor (TR2), and may also protect the first thin-film transistor (TR1) and the second thin-film transistor (TR2).

A first electrode 711 of the display element 710 may be on the planarization layer 190. The first electrode 711 of the display element 710 may be connected to the source electrode (S2) of the second thin-film transistor (TR2) via a contact hole in the planarization layer 190.

A bank layer 750 may be in an edge of the first electrode 711. The bank layer 750 may define an emission area of the display element 710.

An organic emission layer 712 may be on the first electrode 711, and a second electrode 713 may be on the organic emission layer 712, whereby the display element 710 may be completed. The display element 710 shown in the example of FIG. 17 may correspond to the organic light-emitting diode (OLED). Accordingly, the display device according to one embodiment of the present disclosure may correspond to the organic light-emitting display device.

Figure 18:
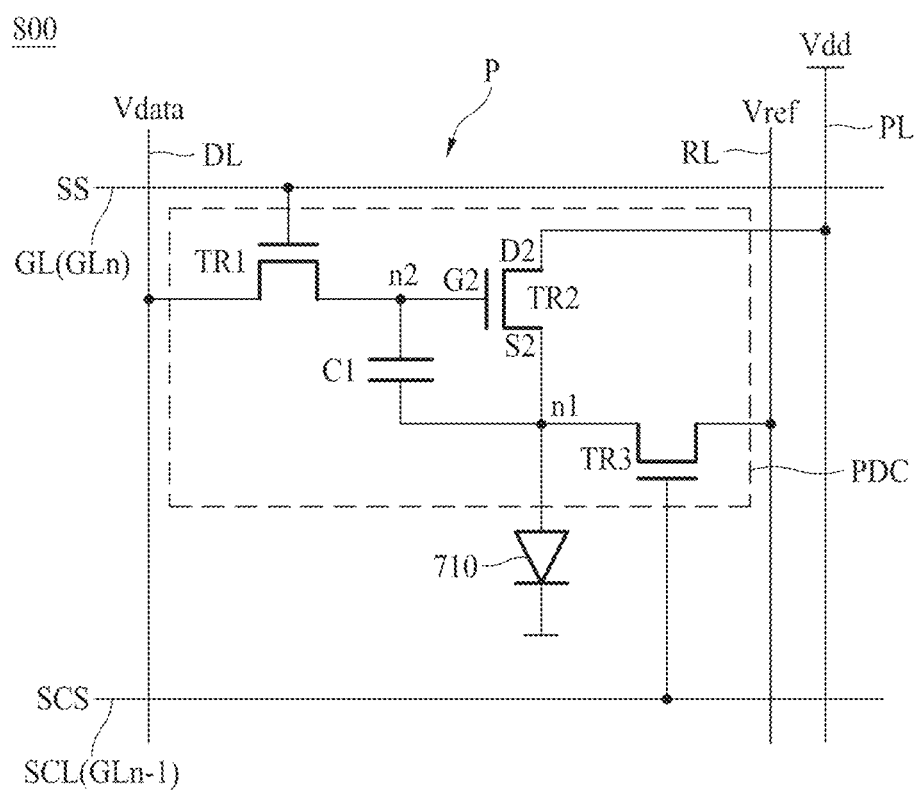
FIG. 18 is a circuit diagram illustrating a pixel of a display device according to another embodiment of the present disclosure.

FIG. 18 is a circuit diagram illustrating any one pixel of a display device according to another embodiment of the present disclosure.

FIG. 18 is an equivalent circuit diagram for a pixel (P) of an organic light-emitting display device. The pixel (P) of a display device 800, shown in the example of FIG. 18, may include an organic light-emitting diode (OLED) corresponding to a display element 710, and a pixel driving circuit (PDC) for driving the display element 710. The display element 710 may be connected to the pixel driving circuit (PDC).

In the pixel (P), there may be signal lines (DL, GL, PL, RL, SCL) for supplying a signal to the pixel driving circuit (PDC). A data voltage (Vdata) may be supplied to a data line (DL), a scan signal (SS) may be supplied to a gate line (GL), a driving voltage (VDD) for driving the pixel may be supplied to a driving voltage line (PL), a reference voltage (Vref) may be supplied to a reference line (RL), and a sensing control signal (SCS) may be supplied to a sensing control line (SCL). With reference to FIG. 18, when the gate line of the $n^{th}$ pixel (P) is referred to as "GLn", the gate line of the neighboring $(n-1)^{th}$ pixel (P) is "GLn−1", and the gate line of the $(n-1)^{th}$ pixel (P) may serve as the sensing control line (SCL) of the $n^{th}$ pixel (P).

For example, the pixel driving circuit (PDC) may include a first thin-film transistor (TR1, e.g., a switching transistor) connected to the gate line (GL) and the data line (DL), a second thin-film transistor (TR2, e.g., a driving transistor) configured to control a level of current provided to the display element 710 in accordance with the data voltage (Vdata) transmitted through the first thin-film transistor (TR1), and a third thin-film transistor (TR3, reference transistor) configured to sense the properties of the second thin-film transistor (TR2). A first capacitor (C1) may be between the display element 710 and a gate electrode (G2) of the second thin-film transistor (TR2). The first capacitor (C1) may be referred to as a "storage capacitor (Cst)."

The first thin-film transistor (TR1) may be turned on by the scan signal (SS) supplied to the gate line (GL), and the first thin-film transistor (TR1) may transmit the data voltage (Vdata), which may be supplied to the data line (DL), to the gate electrode (G2) of the second thin-film transistor (TR2). The third thin-film transistor (TR3) may be connected to the reference line (RL) and a first node (n1) between the display element 710 and the second thin-film transistor (TR2). The third thin-film transistor (TR3) may be turned on or turned off by the sensing control signal (SCS), and the third thin-film transistor (TR3) may sense the properties of the second thin-film transistor (TR2) corresponding the driving transistor for a sensing period.

A second node (n2) connected to the gate electrode (G2) of the second thin-film transistor (TR2) may be connected to the first thin-film transistor (TR1). The first capacitor (C1) may be between the second node (n2) and the first node (n1).

When the first thin-film transistor (TR1) is turned on, the data voltage (Vdata) supplied through the data line (DL) may be supplied to the gate electrode (G2) of the second thin-film transistor (TR2). The first capacitor (C1) between a source electrode (S2) and the gate electrode (G2) of the second thin-film transistor (TR2) may be charged with the data voltage (Vdata). When the second thin-film transistor (TR2) is turned on, a current may be supplied to the display element 710 through the second thin-film transistor (TR2) by the driving voltage (Vdd) for driving the pixel, whereby light may be emitted from the display element 710.

The first thin-film transistor (TR1), the second thin-film transistor (TR2), and the third thin-film transistor (TR3) shown in the example of FIG. 18 may be substantially similar in structure to any one among the thin-film transistors 100, 200, 300, 400, 500, and 600 shown in the examples of FIGS. 1, 2, 3, 4, 5, and 6.

Figure 19:
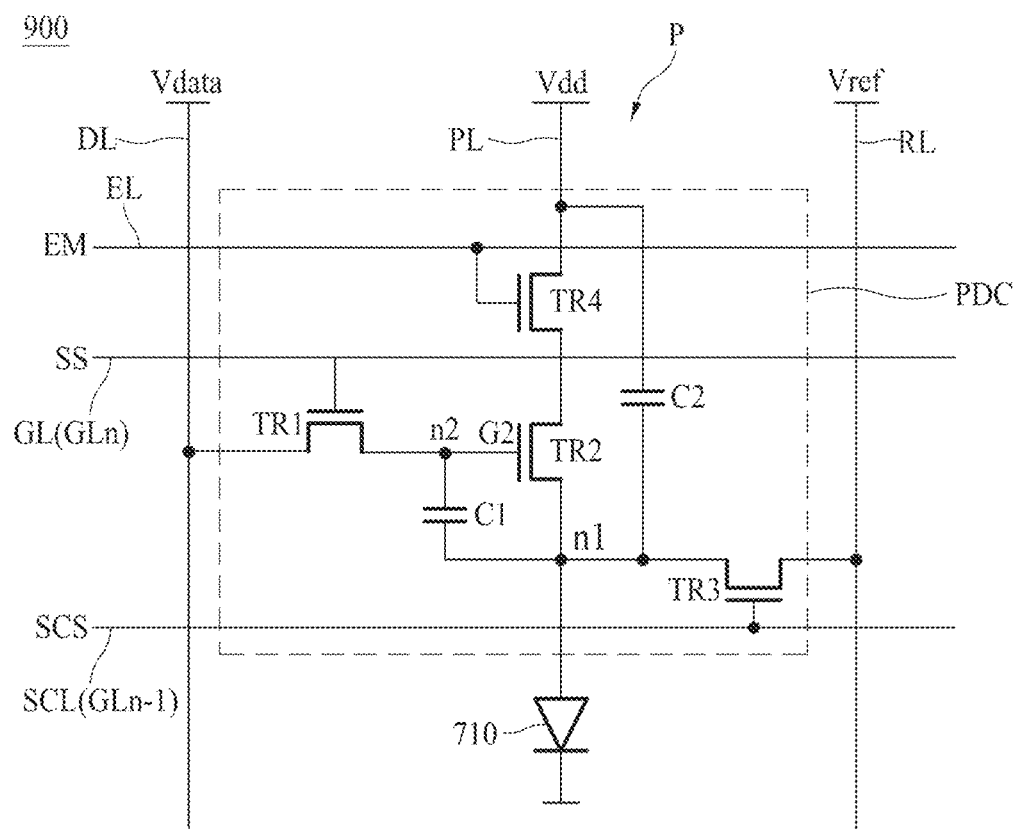
FIG. 19 is a circuit diagram illustrating a pixel of a display device according to another embodiment of the present disclosure.

FIG. 19 is a circuit diagram illustrating a pixel of a display device according to another embodiment of the present disclosure.

The pixel (P) of a display device 900 shown in FIG. 19 may include an organic light-emitting diode (OLED) corresponding to a display element 710, and a pixel driving circuit (PDC) for driving the display element 710. The display element 710 may be connected to the pixel driving circuit (PDC).

The pixel driving circuit (PDC) may include thin-film transistors (TR1, TR2, TR3, TR4). In the pixel (P), there may be signal lines (DL, EL, GL, PL, SCL, RL) for supplying a driving signal to the pixel driving circuit (PDC).

In comparison with the pixel (P) of the FIG. 18 example, the pixel (P) of the FIG. 19 example may further include an emission control line (EL). An emission control signal (EM) may be supplied to the emission control line (EL). Also, in comparison with the pixel driving circuit (PDC) of FIG. 18, the pixel driving circuit (PDC) of FIG. 19 may further include a fourth thin-film transistor (TR4) corresponding to an emission control transistor configured to control an emission time point of the second thin-film transistor (TR2).

With reference to FIG. 19, when the gate line of the $n^{th}$ pixel (P) is referred to as "GLn", the gate line of the neighboring $(n-1)^{th}$ pixel (P) is "GLn−1", and the gate line of the $(n-1)^{th}$ pixel (P) may serve as the sensing control line (SCL) of the $n^{th}$ pixel (P). A first capacitor (C1) may be between the display element 710 and a gate electrode (G2) of the second thin-film transistor (TR2). Also, a second capacitor (C2) may be between one electrode of the display element 710 and a terminal supplied with a driving voltage (Vdd) among a plurality of terminals included in the fourth thin-film transistor (TR4).

The first thin-film transistor (TR1) may be turned on by the scan signal (SS) supplied to the gate line (GL), and the first thin-film transistor (TR1) may transmit the data voltage (Vdata), which may be supplied to the data line (DL), to the gate electrode (G2) of the second thin-film transistor (TR2). The third thin-film transistor (TR3) may be connected to the reference line (RL), and may be turned on or turned off by the sensing control signal (SCS), and the third thin-film transistor (TR3) may sense the properties of the second thin-film transistor (TR2) corresponding the driving transistor for a sensing period.

The fourth thin-film transistor (TR4) may transmit the driving voltage (Vdd) to the second thin-film transistor (TR2), or may block the driving voltage (Vdd) in accordance with the emission control signal (EM). When the fourth thin-film transistor (TR4) is turned on, a current may be supplied to the second thin-film transistor (TR2), whereby light may be emitted from the display element 710.

The first thin-film transistor (TR1), the second thin-film transistor (TR2), the third thin-film transistor (TR3) and the fourth thin-film transistor (TR4) shown in the example of FIG. 19 may be substantially similar in structure to any one among the thin-film transistors 100, 200, 300, 400, 500, and 600 shown in the examples of FIGS. 1, 2, 3, 4, 5, and 6.

The pixel driving circuit (PDC) according to another embodiment of the present disclosure may be formed in various structures, in addition to the above-described structure. For example, the pixel driving circuit (PDC) may include five or more thin-film transistors.

According to one embodiment of the present disclosure, the thin-film transistor may include the first oxide semiconductor layer serving as the main channel layer, and the second oxide semiconductor layer serving as the interfacial channel layer on the main channel layer, wherein the second oxide semiconductor layer serving as the interfacial channel layer may protect the first oxide semiconductor layer serving as the main channel layer. According as the main channel layer is protected, the thin-film transistor according to one embodiment of the present disclosure may have good driving stability and reliability. Also, the display device including the thin-film transistor according to one embodiment of the present disclosure may have great picture quality.

According to another embodiment of the present disclosure, the thin-film transistor may include the semiconductor layer provided with the plurality of oxide semiconductor layers, wherein the mixture area between each of the plurality of oxide semiconductor layers constituting the semiconductor layer may have a reduced or minimized thickness. As a result, even though each of the oxide semiconductor layers may be formed in the thin profile, each oxide semiconductor layer may perform its own function.

According to another embodiment of the present disclosure, the thin-film transistor may include the high-density gate insulating layer. According as the high-density gate insulating layer is used, it may be possible to reduce, minimize, or prevent the electron trap by the gate insulating layer, thereby preventing the defect in the semiconductor layer caused by the loss of electrons.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A thin-film transistor, comprising:
a base substrate;
a semiconductor layer on the base substrate, the semiconductor layer comprising:
a first oxide semiconductor layer; and
a second oxide semiconductor layer on the first oxide semiconductor layer, the second oxide semiconductor layer having a Hall mobility smaller than a Hall mobility of the first oxide semiconductor layer;
a gate electrode spaced apart from the semiconductor layer and partially overlapping the semiconductor layer; and
a first mixture area between the first oxide semiconductor layer and the second oxide semiconductor layer,
wherein a concentration of gallium (Ga) in the second oxide semiconductor layer is higher than a concentration of gallium (Ga) in the first oxide semiconductor layer, and
wherein a thickness of the first mixture area is 3 nm or less.

2. The thin-film transistor of claim 1, wherein the second oxide semiconductor layer is closer to the gate electrode in comparison with the first oxide semiconductor layer.

3. The thin-film transistor of claim 1, wherein:
the gate electrode is between the semiconductor layer and the base substrate; and
the first oxide semiconductor layer is closer to the gate electrode in comparison with the second oxide semiconductor layer.

4. The thin-film transistor of claim 1, wherein the first oxide semiconductor layer comprises indium (In).

5. The thin-film transistor of claim 1, wherein the second oxide semiconductor layer comprises gallium (Ga) of 40 atom % or more in comparison with a total metallic element with respect to a number of atoms.

6. The thin-film transistor of claim 1, wherein the second oxide semiconductor layer is thinner than the first oxide semiconductor layer.

7. The thin-film transistor of claim 6, wherein the second oxide semiconductor layer has a thickness of 1 nm to 10 nm.

8. The thin-film transistor of claim 1, further comprising:
a source electrode and a drain electrode spaced apart from each other and respectively connected to the semiconductor layer,
wherein the source electrode and the drain electrode contact the second oxide semiconductor layer.

9. The thin-film transistor of claim 8, wherein the source electrode and the drain electrode do not contact the first oxide semiconductor layer.

10. The thin-film transistor of claim 1, wherein:
the semiconductor layer further comprises a third oxide semiconductor layer; and
the first oxide semiconductor layer is between the second oxide semiconductor layer and the third oxide semiconductor layer.

11. The thin-film transistor of claim 10, wherein the third oxide semiconductor layer has a higher concentration of gallium (Ga) than a concentration of gallium of the second oxide semiconductor layer.

12. The thin-film transistor of claim 1, wherein the first mixture area has a density x,
where $[(3 \times N1+N2)/4] \leq x \leq [(N1+3 \times N2)/4]$, and
where:
"N1" is a density of the first oxide semiconductor layer, and
"N2" is a density of the second oxide semiconductor layer.

13. The thin-film transistor of claim 1, further comprising:
a third oxide semiconductor layer in the semiconductor layer, the first oxide semiconductor layer being between the second oxide semiconductor layer and the third oxide semiconductor layer; and
a second mixture area between the first oxide semiconductor layer and the third oxide semiconductor layer,
wherein a thickness of the second mixture area is 3 nm or less.

14. The thin-film transistor of claim 13, wherein the second mixture area has a density x,
where $[(3 \times N1+N3)/4] \leq x \leq [(N1+3 \times N3)/4]$, and
where:
"N1" is a density of the first oxide semiconductor layer, and
"N3" is a density of the third oxide semiconductor layer.

15. The thin-film transistor of claim 1, further comprising:
a gate insulating layer between the semiconductor layer and the gate electrode,
wherein the gate insulating layer comprises an $SiO_2$-based oxide comprising silicon and oxygen, and
wherein the gate insulating layer comprises hydrogen (H) of 2 atom % or less in comparison with a total number of atoms of the gate insulating layer.

16. A thin-film transistor, comprising:
a base substrate;
a semiconductor layer on the base substrate, the semiconductor layer comprising:
  a first oxide semiconductor layer; and
  a second oxide semiconductor layer on the first oxide semiconductor layer, the second oxide semiconductor layer having a Hall mobility smaller than a Hall mobility of the first oxide semiconductor layer;
a gate electrode spaced apart from the semiconductor layer and partially overlapping the semiconductor layer; and
a mixture area between the first oxide semiconductor layer and the second oxide semiconductor layer,
wherein a concentration of gallium (Ga) in the second oxide semiconductor layer is higher than a concentration of gallium (Ga) in the first oxide semiconductor layer,
wherein the mixture area, the first oxide semiconductor layer, and the second oxide semiconductor layer are formed by metal-organic chemical vapor deposition (MOCVD), and
wherein a thickness of the mixture area is 3 nm or less.

17. A display device, comprising:
a base substrate;
a pixel driving circuit on the base substrate, the pixel driving circuit comprising a thin-film transistor, the thin-film transistor comprising:
  a semiconductor layer on the base substrate, the semiconductor layer comprising:
    a first oxide semiconductor layer; and
    a second oxide semiconductor layer on the first oxide semiconductor layer, the second oxide semiconductor layer having a Hall mobility smaller than a Hall mobility of the first oxide semiconductor layer; and
  a gate electrode spaced apart from the semiconductor layer and partially overlapping the semiconductor layer; and
a display element connected to the pixel driving circuit,
wherein a concentration of gallium (Ga) in the second oxide semiconductor layer is higher than a concentration of gallium (Ga) in the first oxide semiconductor layer, and
wherein the semiconductor layer further comprises a third oxide semiconductor layer,
wherein a concentration of gallium (Ga) in the third oxide semiconductor layer is higher than a concentration of gallium (Ga) in the second oxide semiconductor layer, and
wherein the first oxide semiconductor layer is between the second oxide semiconductor layer and the third oxide semiconductor layer.

18. The display device of claim 17, wherein the second oxide semiconductor layer is thinner than the first oxide semiconductor layer.

19. The display device of claim 17, wherein the second oxide semiconductor layer has a thickness of 1 nm to 10 nm.

20. The display device of claim 17, wherein the second oxide semiconductor layer comprises gallium (Ga) of 40 atom % or more in comparison with a total metallic element with respect to a number of atoms.

21. The display device of claim 17, wherein the third oxide semiconductor layer comprises gallium (Ga) of 40 atom % or more in comparison with a total metallic element with respect to a number of atoms.

22. A method of manufacturing a thin-film transistor, the method comprising:
providing a base substrate;
providing a semiconductor layer on the base substrate, the providing the semiconductor layer comprising:
  forming a first oxide semiconductor layer by metal-organic chemical vapor deposition (MOCVD); and
  forming a second oxide semiconductor layer, by MOCVD, on the first oxide semiconductor layer, the second oxide semiconductor layer having a Hall mobility smaller than a Hall mobility of the first oxide semiconductor layer; and
providing a gate electrode spaced apart from the semiconductor layer and partially overlapping the semiconductor layer;
forming a third oxide semiconductor layer, by MOCVD, in the semiconductor layer;
forming a first mixture area, by MOCVD, between the first oxide semiconductor layer and the second oxide semiconductor layer; and
forming a second mixture area, by MOCVD, between the first oxide semiconductor layer and the third oxide semiconductor layer,
wherein a concentration of gallium (Ga) in the second oxide semiconductor layer is higher than a concentration of gallium (Ga) in the first oxide semiconductor layer,
wherein the first oxide semiconductor layer is between the second oxide semiconductor layer and the third oxide semiconductor layer, and
wherein a concentration of gallium (Ga) in the third oxide semiconductor layer is higher than a concentration of gallium (Ga) in the second oxide semiconductor layer.

23. The method of claim 22, wherein:
a thickness of the mixture area is 3 nm or less; and
a thickness of the second mixture area is 3 nm or less.

* * * * *